(12) United States Patent
Meguro et al.

(10) Patent No.: US 8,410,355 B2
(45) Date of Patent: Apr. 2, 2013

(54) THIN FILM PHOTOELECTRIC CONVERSION DEVICE HAVING A STACKED TRANSPARENT OXIDE AND CARBON INTERMEDIATE LAYER

(75) Inventors: Tomomi Meguro, Settsu (JP); Mitsuru Ichikawa, Settsu (JP); Fumiyasu Sezaki, Settsu (JP); Kunta Yoshikawa, Settsu (JP); Takashi Kuchiyama, Settsu (JP); Kenji Yamamoto, Settsu (JP)

(73) Assignee: Kaneka Corporation, Osaka-shi (JP)

( * ) Notice: Subject to any disclaimer, the term of this patent is extended or adjusted under 35 U.S.C. 154(b) by 397 days.

(21) Appl. No.: 12/740,338

(22) PCT Filed: Oct. 30, 2008

(86) PCT No.: PCT/JP2008/069766
§ 371 (c)(1),
(2), (4) Date: Apr. 28, 2010

(87) PCT Pub. No.: WO2009/057698
PCT Pub. Date: May 7, 2009

(65) Prior Publication Data
US 2010/0243058 A1 Sep. 30, 2010

(30) Foreign Application Priority Data

Nov. 2, 2007 (JP) ................................. 2007-286145
Dec. 14, 2007 (JP) ................................. 2007-323883
Mar. 25, 2008 (JP) ................................. 2008-078774

(51) Int. Cl.
*H01L 31/00* (2006.01)
(52) U.S. Cl. ........ 136/261; 136/243; 136/255; 136/256; 136/258; 428/428; 428/432; 428/688; 428/689; 428/699; 428/701; 428/702; 257/E27.001; 257/E27.124

(58) Field of Classification Search .................. 136/243, 136/255, 256, 258, 261; 428/428, 432, 688, 428/689, 699, 701, 702; 257/E27.001, E27.124
See application file for complete search history.

(56) References Cited

U.S. PATENT DOCUMENTS
(Continued)

FOREIGN PATENT DOCUMENTS
JP 4127580 4/1992
JP 5110125 4/1993
(Continued)

OTHER PUBLICATIONS
ISA Japanese Patent Office, International Search Report of PCT/JP2008/069766, Dec. 2, 2008, Japan, 2 pages.
(Continued)

*Primary Examiner* — Jonathan Johnson
*Assistant Examiner* — Angelo Trivisonno
(74) *Attorney, Agent, or Firm* — Alleman Hall McCoy Russell & Tuttle LLP

(57) ABSTRACT

This invention intends to develop a technique for forming an interlayer with excellent optical characteristics and to provide a photoelectric conversion device having high conversion efficiency. To realize this purpose, a series connection through an intermediate layer is formed in the thin-film photoelectric conversion device of the invention, and the interlayer is a transparent oxide layer in its front surface and n pairs of layers stacked therebehind (n is an integer of 1 or more), wherein each of the pair of layers is a carbon layer and a transparent oxide layer stacked in this order. Film thicknesses of each layer are optimized to improve wavelength selectivity and stress resistance while keeping the series resistance.

14 Claims, 8 Drawing Sheets

U.S. PATENT DOCUMENTS

| | | |
|---|---|---|
| 5,021,100 A | 6/1991 | Ishihara et al. |
| 2004/0187914 A1 | 9/2004 | Matsuda et al. |
| 2006/0043517 A1 | 3/2006 | Sasaki et al. |
| 2006/0060869 A1* | 3/2006 | Yang et al. ............... 257/85 |

FOREIGN PATENT DOCUMENTS

| | | |
|---|---|---|
| JP | 2001267598 | 9/2001 |
| JP | 2001308354 | 11/2001 |
| JP | 2003142709 | 5/2003 |
| JP | 2003179241 | 6/2003 |
| JP | 2004260014 | 9/2004 |
| JP | 2006120737 | 5/2006 |

OTHER PUBLICATIONS

ISA The International Bureau of WIPO, International Preliminary Report on Patentability for International Application No. PCT/JP2008/069766, Jun. 10, 2010, 5 pages.

* cited by examiner

THIN FILM PHOTOELECTRIC CONVERSION DEVICE HAVING A STACKED TRANSPARENT OXIDE AND CARBON INTERMEDIATE LAYER

TECHNICAL FIELD

The present invention relates to a thin-film photoelectric conversion device having an interlayer. In addition, the invention relates to an improvement in a back face electrode layer of a thin-film photoelectric conversion device.

BACKGROUND ART

A photoelectric conversion device for converting light into electricity by using photoelectric effect performed inside a semiconductor has been spotlighted and vigorously developed in recent years. Among the photoelectric conversion devices, a silicon-based thin-film photoelectric conversion device may be expected for lower cost by reason of being formed on a glass substrate or a stainless-steel substrate with large area at low temperature.

The thin-film photoelectric conversion device generally includes a first electrode, one or more semiconductor thin-film photoelectric conversion units, and a second electrode laminated sequentially on a substrate with an insulating surface. The photoelectric conversion unit generally has a structure of a p-type layer, an i-type layer, and an n-type layer stacked in this order; the photoelectric conversion units such that an i-type photoelectric conversion layer, which occupies the main part thereof, is amorphous are referred to as amorphous photoelectric conversion units, and the photoelectric conversion units such that an i-type layer is crystalline are referred to as crystalline photoelectric conversion units.

A photoelectric conversion device having a structure referred to as a multi-junction type, in which two or more photoelectric conversion units are stacked, is known for improving conversion efficiency of a photoelectric conversion device. In a multi-junction type photoelectric conversion device, a photoelectric conversion unit including a photoelectric conversion layer with a large optical band gap is disposed on a light incidence side of the device and one or more photoelectric conversion units including a photoelectric conversion layer with a small band gap are sequentially disposed therebehind, so that photoelectric conversion of incident light over a wide wavelength range may be performed and an improvement in conversion efficiency for the entire device is intended by effectively utilizing incident light.

In the present application, the photoelectric conversion unit disposed relatively on the light incidence side is referred to as a front photoelectric conversion unit, and the photoelectric conversion unit disposed adjacently on the far side from the light incidence side relatively thereto is referred to as a back photoelectric conversion unit. In a case where a photoelectric conversion device has three or more stacked photoelectric conversion units, the back photoelectric conversion units disposed secondly or more from the light incidence side are regarded as front photoelectric conversion unit(s) and the back photoelectric conversion unit disposed adjacently on the far side from the light incidence side relative to the front photoelectric conversion unit(s) exists by plurality.

The above-mentioned multi-junction structure allows incident light to be effectively utilized, however, the properties of the entire multi-junction photoelectric conversion device may be restricted. Particularly, a short-circuit current density of the entire multi-junction photoelectric conversion device is restricted to a short-circuit current density of a photoelectric conversion unit having smaller short-current density. Accordingly, a balance between short-circuit current density generated in each of the photoelectric conversion unit needs to be achieved for improving the properties of the entire multi-junction photoelectric conversion device.

In this point of view, a stacked type photoelectric conversion device having a structure wherein a conductive interlayer having both light transmission and light reflectivity is interposed between laminated photoelectric conversion units has been proposed in recent years. In this case, part of the light reaching the interlayer may be reflected to increase light absorption in a front photoelectric conversion unit located on the light incidence side more than the interlayer and a photocurrent value of the front photoelectric conversion unit is increased.

For example, when an intermediate reflecting layer is inserted into a hybrid photoelectric conversion device formed of an amorphous silicon photoelectric conversion unit and a crystalline silicon photoelectric conversion unit, photocurrent generated in the amorphous silicon photoelectric conversion unit may be increased without increasing the film thickness of an amorphous silicon layer.

In addition, a deterioration of properties of amorphous silicon photoelectric conversion may be repressed. This is because the photodegradation, which becomes remarkable in accordance with an increase in the film thickness of an amorphous silicon layer, may be repressed, since the film thickness of the amorphous silicon layer necessary for obtaining the same current value may be thinned.

It is preferable that such an interlayer selectively reflects a wavelength range of light absorbed in a front photoelectric conversion unit and selectively transmits a wavelength range of light absorbed in a back photoelectric conversion unit. The interlayer is formed of a plurality of thin films having different refractive indexes, so that interference of light may be caused to improve transmittance or reflectance in a specific wavelength range.

When the film thickness of the interlayer is increased, a higher-order interference wave may be utilized and transmittance or reflectance may be changed more steeply with respect to the wavelength. However, the simple thickening of the film increases light absorption and series resistance derived from the components.

As an example in which such a conductive interlayer with both light transmission and light reflectivity is inserted, Patent Document 1, for example, discloses that an interlayer comprising only a conductive oxygenated silicon layer is inserted between photoelectric conversion units to thereby control reflection and transmission amounts of light and increase short-circuit current density as compared with the case where no interlayer is inserted. However, considering that the refractive index of the conductive oxygenated silicon layer is approximately 1.95 and the refractive index of a silicon layer forming the photoelectric conversion units is approximately 3.3, satisfactory reflection properties are not obtained for the reason that a difference of refractive indexes is not sufficient.

Patent Document 2 discloses that a multilayer film in which a plurality of materials are alternately stacked is inserted as an interlayer. However, a polycrystalline silicon layer is used as part of the multilayer film, in this case it is conceived that wavelength-selectivity is improved by refractive index differences in the multilayer film, but still sufficient reflection properties are not obtained by reason of being the same material and refractive index as a silicon layer forming the photoelectric conversion units. The insertion of the polycrystalline silicon layer having an optically significant thickness causes absorption loss in the polycrystalline silicon layer.

In the meantime, a thin-film solar cell as a typical example of a thin-film photoelectric conversion device has been diversified in recent years. A crystalline thin-film solar cell has been developed in addition to a conventional amorphous thin-film solar cell, and a hybrid thin-film solar cell having a stack of these solar cell units has been put to practical use. A thin-film solar cell generally includes a transparent conductive film, at least one or more photoelectric conversion units, a transparent electrode layer, and a high reflecting electrode layer stacked sequentially on a transparent insulating substrate located on the light incidence side. Each photoelectric conversion unit includes an i-type layer sandwiched between a p-type layer and an n-type layer.

An i-type layer as a substantially intrinsic semiconductor layer comprises a large portion of the thickness of the photoelectric conversion unit, and the photoelectric conversion occurs mainly in this i-type layer. Accordingly, the film thickness of the i-type layer as a photoelectric conversion layer is preferably thicker for light absorption, and thickening the i-type layer more than necessary increases cost and time for accumulation thereof. On the other hand, the p-type and n-type conductive layers serve to cause diffusion potential in the photoelectric conversion unit, and the value of this diffusion potential influences the value of open-circuit voltage as one of the important properties of a thin-film solar cell.

However, these conductive layers are inactive layers and have no contribution to photoelectric conversion, and thus light absorbed by impurities doped into the conductive layers does not contribute to electric power generation but becomes loss. Accordingly, the film thickness of the p-type and n-type conductive layers is preferably thinned as much as possible within a range of causing sufficient diffusion potential. With regard to the above-mentioned photoelectric conversion unit, whether the p-type and n-type conductive layers included therein are amorphous or crystalline, the photoelectric conversion unit such that the i-type photoelectric conversion layer is amorphous is referred to as an amorphous photoelectric conversion unit, and the photoelectric conversion unit such that the i-type layer is crystalline is referred to as a crystalline photoelectric conversion unit.

The term 'crystalline' in the present application includes a partially amorphous state as generally used in the technical field of a thin-film photoelectric conversion device. One example of a thin-film solar cell having an amorphous photoelectric conversion unit includes an amorphous thin-film silicon solar cell such that amorphous silicon is used for the i-type photoelectric conversion layer. One example of a thin-film solar cell having a crystalline photoelectric conversion unit includes a crystalline thin-film silicon solar cell such that microcrystalline silicon and polycrystalline silicon are used for the i-type photoelectric conversion layer.

Incidentally, examples of a technique for improving conversion efficiency of a thin-film solar cell include stacking two or more semiconductor thin-film photoelectric conversion units into a tandem type structure. In this technique, a photoelectric conversion unit having a photoelectric conversion layer with large band gap is disposed on the light incidence side of a thin-film solar cell and a photoelectric conversion unit having a photoelectric conversion layer with a small band gap is sequentially disposed therebehind, so that photoelectric conversion of incident light over a wide wavelength range may be performed and thereby an improvement in conversion efficiency for the entire thin-film solar cell is intended.

Among such tandem type thin-film solar cells, a thin-film solar cell including both an amorphous photoelectric conversion unit and a crystalline photoelectric conversion unit may be referred to particularly as a hybrid thin-film solar cell.

For example, in a hybrid thin-film solar cell in which an amorphous silicon photoelectric conversion unit such that an i-type amorphous silicon with a wide band gap is used for a photoelectric conversion layer and a crystalline silicon photoelectric conversion unit such that an i-type crystalline silicon with a narrow band gap is used for a photoelectric conversion layer are stacked, a wavelength of light capable of being subjected to photoelectric conversion by the i-type amorphous silicon is up to approximately 800 nm on the long-wavelength side and meanwhile light with a wavelength of up to approximately 1100 nm longer than it may be subjected to photoelectric conversion by the i-type crystalline silicon. Therefore, incident light in a wider range may be effectively subjected to photoelectric conversion in a hybrid thin-film solar cell In order to utilize incident light on a photoelectric conversion unit more effectively, a high reflecting electrode layer made of metallic materials with high light reflectance is formed in a thin-film photoelectric conversion device. Transmitted light without being absorbed in a photoelectric conversion unit is reflected by the high reflecting electrode layer and enters the photoelectric conversion unit again to be subjected to photoelectric conversion, so that conversion efficiency of a thin-film photoelectric conversion device is improved.

On the other hand, a transparent electrode layer is provided between the photoelectric conversion unit and the high reflecting electrode layer to intend an improvement in adhesion properties between the photoelectric conversion unit and the high reflecting electrode layer and prevent metallic materials for the high reflecting electrode layer from diffusing and mixing into the photoelectric conversion unit. However, the insertion of the transparent electrode layer is effective in the above-mentioned intention, but yet greatly influences the film quality of the high reflecting electrode layer depending on the forming conditions of the transparent electrode to cause functional depression as the reflecting layer.

Further, the transparent electrode layer occasionally becomes a barrier in electrical contact between the photoelectric conversion unit and the high reflecting electrode layer and does not sufficiently function as a take-out electrode, so that the properties as a solar cell are occasionally deteriorated.

In addition, absorption loss is caused in an interface between the transparent electrode layer and the high reflecting electrode layer to substantially decrease incident light into a silicon layer and decrease the properties of a solar cell.

With regard to this problem, in Patent Document 3, an element for controlling electrical conductivity is contained in the transparent electrode layer to change this element in a film thickness direction, so that electrical conductivity is changed to intend an improvement in electrical contact. However, in this method, series resistance of a solar cell can be decreased but yet in the case of increasing the content of the element for decreasing electrical conductivity, transmittance is decreased and incident light into a silicon layer is decreased.

Patent Document 3 is silent to solutions for interface absorption between the transparent electrode layer and the high reflecting electrode layer. Patent Document 4 discloses that interface absorption loss is decreased by inserting a refractive index control layer between the transparent electrode layer and the high reflecting electrode layer. However, in Patent Document 4, the refractive index control layer is not made of conductive materials and only an insulator is disclosed, the refractive index control layer act as a barrier in electrical contact between the transparent electrode layer and the high reflecting electrode layer. The point that the properties are greatly deteriorated due to an increase in series resistance is not considered at all.

Patent Document 1: Japanese Unexamined Patent Publication No. 2005-135987
Patent Document 2: Japanese Unexamined Patent Publication No. 2001-308354
Patent Document 3: Japanese Unexamined Patent Publication No. 5-110125
Patent Document 4: Japanese Unexamined Patent Publication No. 2006-120737

DISCLOSURE OF THE INVENTION

Problems to be Solved by the Invention

As described above, a refractive index difference between the front photoelectric conversion unit and the interlayer needs to be increased for obtaining sufficient reflection properties, and for that purpose, the refractive index of the interlayer needs to be decreased as much as possible. As further described above, reflectance needs to be raised in the wavelength range of light absorbed in the front photoelectric conversion unit, while reflectance needs to be lowered in the wavelength range of light absorbed in the back photoelectric conversion unit.

The interlayer is formed of a plurality of thin films having different refractive indexes, so that interference of light may be caused to improve transmittance or reflectance in a specific wavelength range. The film thickness of the interlayer is increased, so that a higher-order interference wave may be utilized and reflectance may be changed more steeply with respect to the wavelength to improve wavelength-selectivity. However, the simple increasing of the film thickness increases light absorption and series resistance derived from the components of the interlayer.

It is necessary to form electrical conductivity and interface bonding such as to be capable of a series connection between the photoelectric conversion units as a path of electric current, but yet the interlayer for satisfying these is not disclosed in the prior art.

This invention has been made in consideration of the circumstances as described above, and an object of the present invention is to provide a photoelectric conversion device with high photoelectric conversion efficiency, such that short-circuit current density generated in each silicon-based thin-film photoelectric conversion unit is balanced at high value, by having an interlayer for offering excellent reflection properties and electrical conductivity.

Further, the present invention solves the above-mentioned problems in the prior art to form a favorable interface bonding between the transparent electrode layer and the high reflecting electrode layer and to provide the high reflecting electrode layer of high quality, whereby a photoelectric conversion device with high conversion efficiency, such that short-circuit current density and fill factor are improved, is obtained.

Means for Solving the Problem

Specifically, a thin-film photoelectric conversion device according to the present invention has the configurations such as the following, for example.

As shown in FIGS. 1 and 5, a thin-film photoelectric conversion device comprises a plurality of silicon-based photoelectric conversion units 3 and 5 connected in series through an interlayer 4.

The interlayer 4 is a transparent oxide layer 4a and n pairs of layers stacked therebehind (n is an integer of 1 or more), wherein each pair of layers is a carbon layer 4b and a transparent oxide layer 4c stacked in this order. Due to this configuration, the carbon layer 4b (and 4d) having electrical conductivity is connected to the photoelectric conversion units 3 and 5 through the transparent oxide layers 4a and 4c (or 4e).

The carbon layer 4b, 4d may contain hydrogen, and may comprise diamond-like carbon. A refractive index of the carbon layer may be 1.25 or more and 1.90 or less against a light with a wavelength of 600 nm. A film thickness of the carbon layer(s) may be 100 Å or more and 2000 Å or less and a total film thickness of the carbon layer(s) may be 200 Å or more and 4000 Å or less.

The transparent oxide layer 4a, 4c, 4e may be formed out of zinc oxide or conductive oxygenated silicon. A film thickness of the transparent oxide layer(s) may be 10 Å or more and 2000 Å or less, and a total film thickness of the transparent oxide layer(s) may be 40 Å or more and 4000 Å or less.

In a preferred embodiment of the invention, as shown in FIG. 6, a transparent electrode layer 10 having electrical conductivity, a hard carbon layer 11 having electrical conductivity, and a high reflecting electrode layer 12 are stacked in this order on an opposite surface from a light incidence side of the photoelectric conversion layer 9.

The hard carbon layer 11 having electrical conductivity may comprise diamond-like carbon. A film thickness of the hard carbon layer may be 5 Å or more and 2000 Å or less.

The transparent electrode layer 10 may be made of zinc oxide. A film thickness of the transparent electrode layer may be 50 Å or more and 5000 Å or less.

Effect of the Invention

According to the present invention, refractive index difference between an interlayer and a silicon layer is increased, and thus reflection properties to a front photoelectric conversion unit are improved. In addition, film quality and transmittance of the carbon layer are improved by a transparent oxide layer. Therefore, short-circuit current density is increased. Further, as compared with the case where only the carbon layer is inserted, a favorable interface bonding with the photoelectric conversion unit may be formed, so that series resistance is decreased to improve the properties.

Furthermore, as compared with the case where the carbon layer is formed into a film by one layer, stress resistance was remarkably improved by the stack of transparent oxide layer/carbon layer/transparent oxide layer/carbon layer/transparent oxide layer in this order. Thus, productivity was also improved. Adjusting film thickness of the transparent oxide layer and the carbon layer in the interlayer allows reflection properties to be steeply changed in an optional wavelength range of light. Thus, only light with a necessary wavelength for the front photoelectric conversion unit may be reflected by the interlayer so efficiently as to increase photoelectric conversion current.

Through the effects as described above, the present invention may provide a high-performance photoelectric conversion device.

Further, in the present invention, a hard carbon layer having electrical conductivity is inserted between a transparent electrode layer and a high reflecting electrode layer, so that the surface state of the transparent electrode layer is modified to form a favorable electrical contact with the high reflecting electrode layer. In addition, the high reflecting electrode layer having excellent reflection properties is formed to increase incident light into a generating layer. Absorption loss on an interface of a high reflecting electrode layer is decreased to bring the effect of increasing light scattering. According to the present invention, the hard carbon layer may be made of diamond-like carbon to improve conversion efficiency of a photoelectric conversion device by high transmittance and high electrical conductivity.

REFERENCE NUMERALS

Figure 1:
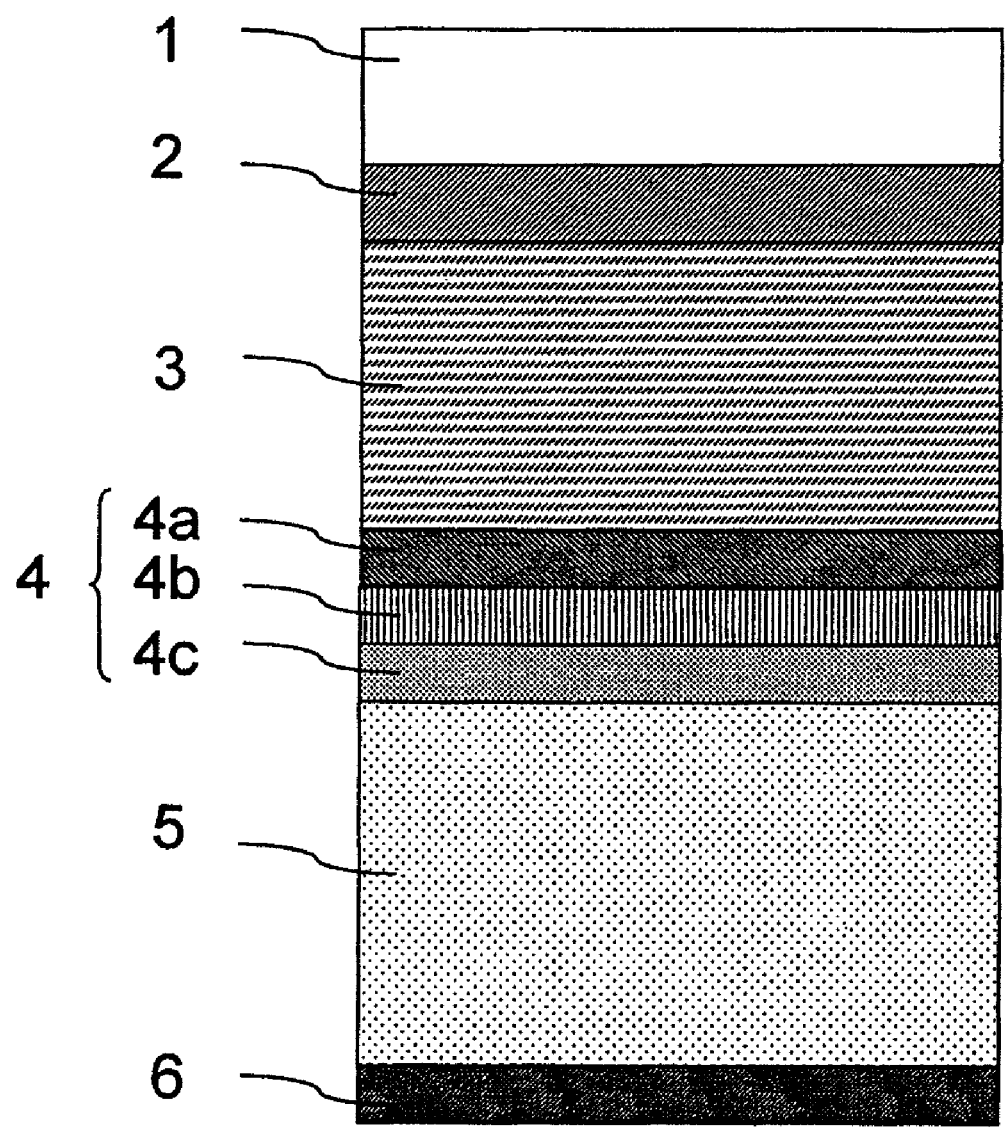
FIG. 1 is a structure cross-sectional view of a photoelectric conversion device according to the present invention.

| | |
|---|---|
| 1 | transparent substrate |
| 2 | transparent electrode layer |
| 3 | front photoelectric conversion unit |
| 4 | interlayer |
| 4a | transparent oxide layer |
| 4b and 4d | carbon layer |
| 4c and 4e | transparent oxide layer |
| 5 | back photoelectric conversion unit |
| 6 | back face electrode layer |
| 7 | transparent insulating substrate |
| 8 | transparent conductive film |
| 9 | amorphous silicon photoelectric conversion unit |
| 9p | amorphous p-type silicon carbide layer |
| 9i | amorphous i-type silicon photoelectric conversion layer |
| 9n | n-type microcrystalline silicon layer |
| 10 | transparent electrode layer |
| 11 | hard carbon layer |
| 12 | high reflecting electrode layer |
| 13 | $SiO_2$ layer |

BEST MODE FOR CARRYING OUT THE INVENTION

With reference to the drawings, the preferred embodiments of the present invention are hereinafter described. In each of the drawings of the present application, the relation of dimensions such as thickness and length is properly modified for clarification and simplification of the drawings, and the actual relation of dimensions is not denoted. In each of the drawing, like reference numerals denote like portions or the corresponding portions.

Figure 5:
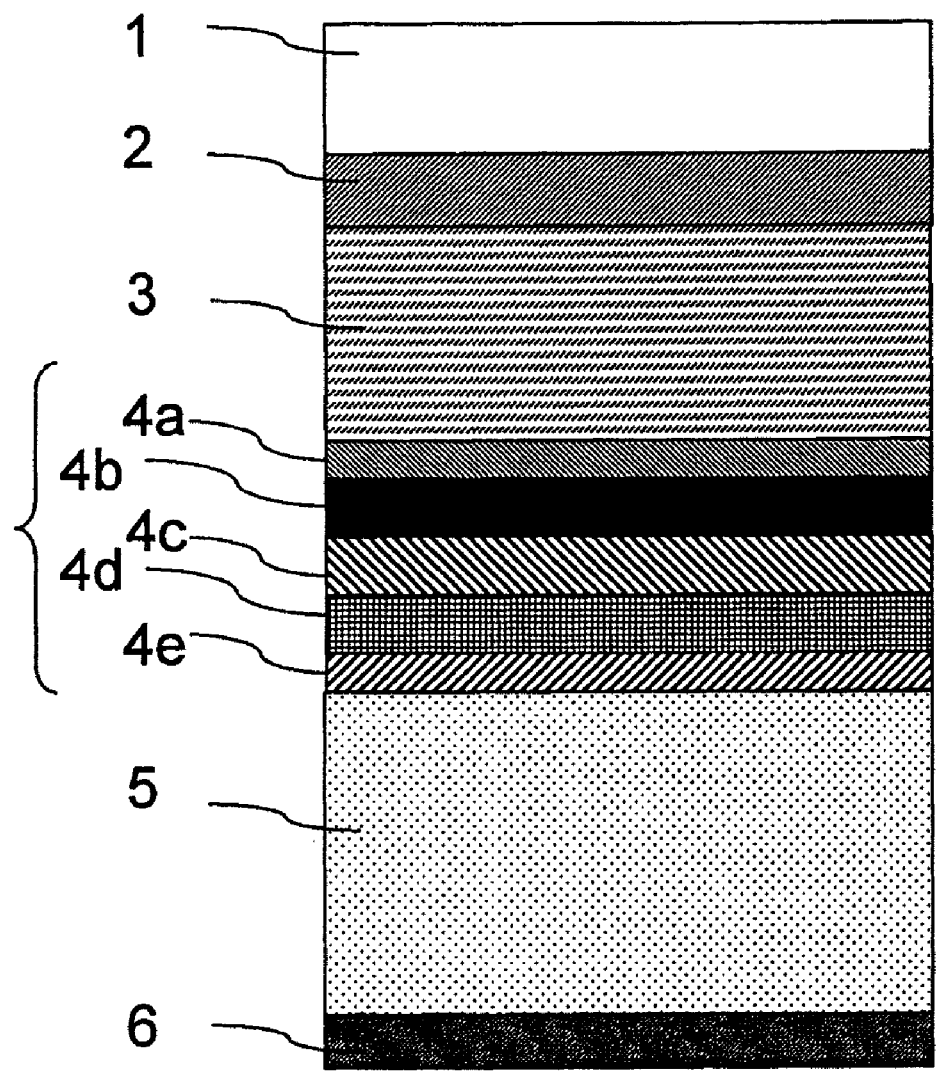
FIG. 5 is a structure cross-sectional view of a photoelectric conversion device according to the present invention.

A cross-sectional view of a photoelectric conversion device according to one example of the embodiments of the present invention is shown in FIGS. 1 and 5. A transparent electrode layer 2, a front photoelectric conversion unit 3, an interlayer 4, a back photoelectric conversion unit 5, and a back face electrode layer 6 are disposed on a transparent substrate 1 in this order. FIG. 1 shows a two-junction photoelectric conversion device in which the photoelectric conversion units are formed of the front photoelectric conversion unit and the back photoelectric conversion unit. The present invention may also be applied to a multi-junction silicon-based photoelectric conversion device in which three or more of the photoelectric conversion units are stacked.

For example, in a three-junction silicon-based photoelectric conversion device in which a first photoelectric conversion unit, a second photoelectric conversion unit, and a third photoelectric conversion unit are disposed in this order from the light incidence side, the first photoelectric conversion unit and the second photoelectric conversion unit may be regarded as the front photoelectric conversion unit and the back photoelectric conversion unit respectively to provide the interlayer in the proximity of a boundary between both.

Alternatively, the second photoelectric conversion unit and the third photoelectric conversion unit may be regarded as the front photoelectric conversion unit and the back photoelectric conversion unit, respectively, to provide the interlayer in the proximity of a boundary between both. Needless to say, a structure may be made such that a silicon composite layer is provided in both the proximity of a boundary between the first photoelectric conversion unit and the second photoelectric conversion unit and the proximity of a boundary between the second photoelectric conversion unit and the third photoelectric conversion unit.

Examples of a three-junction silicon-based photoelectric conversion device include cases where an amorphous silicon photoelectric conversion unit is used as the first photoelectric conversion unit, an amorphous silicon germanium or crystalline silicon photoelectric conversion unit is used as the second photoelectric conversion unit, and an amorphous silicon germanium or crystalline silicon photoelectric conversion unit is used as the third photoelectric conversion unit; yet, the combination is not limited thereto.

As the transparent substrate 1, a tabular member or a sheet-like member made of glass, transparent resin or the like are used for a photoelectric conversion device in which light enters from the substrate side. The transparent electrode layer 2 is preferably made of conductive metallic oxides such as $SnO_2$ and ZnO, and preferably formed by using methods such as CVD, sputtering, and vapor deposition. It is desirable that the transparent electrode layer 2 has so minute irregularities on the surface thereof as to have the effect of increasing the scattering of incident light.

The back face electrode layer 6 preferably comprises at least one metal layer made of at least one material selected from a group of Al, Ag, Au, Cu, Pt and Cr and is preferably formed by a sputtering method or a vapor deposition method. A layer made of conductive oxides such as ITO, $SnO_2$ and ZnO may be formed between the photoelectric conversion unit and the metal electrode (not shown in the Figure).

A plurality of photoelectric conversion units is disposed behind the transparent electrode layer 2 when viewed from the light incidence side. In the case where two photoelectric conversion units are stacked as shown in FIG. 1, a photoelectric conversion unit made of a material with a relatively wide band gap, such as an amorphous silicon material, is used for the front photoelectric conversion unit 3 disposed on the light incidence side.

Ina photoelectric conversion unit 5 disposed behind the front photoelectric conversion unit, a material with a relatively narrower band gap than the front photoelectric conversion unit, such as a photoelectric conversion unit comprising silicon based material with crystalline silicon or an amorphous silicon germanium photoelectric conversion unit, may be used.

Each of the photoelectric conversion units is preferably formed of a pin junction made of a p-type layer, an i-type layer as a substantially intrinsic photoelectric conversion layer, and an n-type layer. Among these, the photoelectric conversion unit such that amorphous silicon is used for the i-type layer is referred to as an amorphous silicon photoelectric conversion unit, and the photoelectric conversion unit such that crystalline silicon is used for the i-type layer is referred to as a crystalline silicon photoelectric conversion unit. An amorphous or crystalline silicon material may be an alloy material containing other elements than silicon such as carbon, oxygen, nitrogen, and germanium, as well as the case where only silicon is used as the main element constituting a semiconductor.

The main component of the conductive layers does not always need to be of the same nature as the i-type layer; for example, amorphous silicon carbide may be used for the p-type layer of the amorphous silicon photoelectric conversion unit, and a crystalline silicon layer (also referred to as μc-Si) may also be used for the n-type layer thereof.

In the present invention, the interlayer 4 having high reflectance against light in the wavelength range absorbed in the front photoelectric conversion unit and low reflectance against light in the wavelength range not absorbed in the front photoelectric conversion unit is used between the front photoelectric conversion unit and the back photoelectric conversion unit.

A multilayer film made of the repetition of a transparent oxide layer 4a, a carbon layer 4b, and a transparent oxide layer 4c is used in above-mentioned interlayer 4. The interlayer is disposed in any position between a photoelectric conversion layer in the front photoelectric conversion unit 3 and a photoelectric conversion layer in the back photoelectric conversion unit 5, so that the interlayer may have a function of intermediate reflecting layer. The interlayer 4 may occasionally serve also as part of the conductive layers in the photoelectric conversion units.

Examples of a transparent oxide layer of the interlayer include tin oxide, zinc oxide, ITO, and conductive oxygenated silicon layer. Particularly, as shown in FIG. 5, a multilayered interlayer formed of the lamination of a multilayer film made of the repetition of a zinc oxide layer 4a, a carbon layer 4b, a zinc oxide layer 4c, a carbon layer 4d and a zinc oxide layer 4e, or the repetition of a conductive oxygenated silicon layer 4a, a carbon layer 4b, a conductive oxygenated silicon layer 4c, a carbon layer 4d and a conductive oxygenated silicon layer 4e is preferably used as the interlayer.

When only a carbon layer as a low refractive index layer is used as an interlayer, it shows more favorable reflection properties by reason of offering a higher refractive index difference from the photoelectric conversion units, but yet ohmic contact with the photoelectric conversion units is so insufficient that favorable electrical contact may not be formed. Then, it is preferable to use an interlayer in which a zinc oxide layer or a conductive oxygenated silicon layer capable of forming electrical contact is inserted between the photoelectric conversion unit and the carbon layer.

In the case where the carbon layer has large thickness for improving wavelength-selectivity, stress resistance becomes so weak as to cause film peeling during or after film formation. On the other hand, in the case where a zinc oxide layer is inserted between the carbon layers, stress resistance may be improved remarkably and wavelength-selectivity may be also improved, since the zinc oxide layer shows a different stress property from carbon, and has electrical conductivity, transparency and refractive index different from carbon.

A method for forming a transparent oxide layer is not particularly limited, as long as a film with uniformity is formed. Examples thereof include PVD methods such as sputtering and vapor deposition, chemical vapor phase methods such as various kinds of CVD methods, and a method for forming a transparent oxide layer by heat treatment after applying a solution containing raw materials for the transparent oxide layer by a spin coat method, a roll coat method, spray coating, and dip coating.

For example, conductive oxygenated silicon may be produced by additionally introducing $CO_2$ gas into a chamber under the same conditions as the production of the n-type μc-Si layer forming the photoelectric conversion units by a plasma enhanced CVD method, whereby the processes are advantageous.

When the carbon layer is produced by a plasma enhanced CVD method, the photoelectric conversion units and the interlayer can be produced in the same plasma enhanced CVD device, so that productivity may be improved. The film thickness of these transparent oxide layers is preferably 10 Å or more and 2000 Å or less. The film thickness of these transparent oxide layers is preferably 10 Å or more and 1000 Å or less in order to form good ohmic contact with a silicon layer, and more preferably 50 Å or more and 500 Å or less, even more preferably 75 Å or more and 200 Å or less, particularly preferably 100 Å or more and 200 Å or less in view of a film thickness balance with the carbon layer.

The film thickness is most preferably 120 Å or more and 200 Å or less. In the case where the film thickness of the transparent oxide layer is too thin, electrical conductivity of the transparent oxide layer is impaired and a series connection with the photoelectric conversion units is prevented. On the other hand, when the film thickness of the transparent oxide layer is too thick, transparency of the transparent oxide layer may be impaired and production cost may be raised.

The carbon layer in the interlayer is not particularly limited, as long as it is formed of components made mainly of a carbon atom; examples thereof include diamond-like carbon, graphite-like carbon, carbon nanotubes and fullerenes. The carbon film may be produced by generally known methods, such as a plasma enhanced CVD method, a vapor deposition method, and a sputtering method, any of which may be used.

In the case where the carbon layer is formed by a plasma enhanced CVD method, ordinarily used raw materials may be used. Examples of a carbon source include methane, benzene, and carbon dioxide; for example, a favorable carbon film may be obtained by a method using methane, or methane and hydrogen.

A fluorine atom may be introduced for improving stability of a transparent electrode layer surface. Tetrafluoromethane, trifluoromethane, difluoromethane, fluoromethane or fluorine-substituted benzene may be used as a carbon source in the case where a fluorine atom is introduced. Methane may be diluted with hydrogen or not, it is important to contain hydrogen in the film. The reason therefor is that a smaller hydrogen amount in the film increases the ratio of a carbon atom with a graphite structure and thus transparency may be impaired.

The hydrogen in the film may be detected by, for example, FT-IR (Fourier transform infrared spectrophotometer), Raman analysis and RBS (Rutherford scattering), and FT-IR is used in the present invention. The power of the plasma is preferably 10 W to 600 W, and the power density is preferably 0.02 W to 1 $W/cm^2$, but not limited thereto. If the plasma power is too low, film may not be formed. On the other hand, when the plasma power is too high, the transparent oxide layer 4a may be etched by plasma.

The film thickness of the carbon layer is preferably 100 Å to 2000 Å in order to maintain properties as the interlayer, and the thickness is preferably 100 Å to 1200 Å, more preferably 500 Å to 1000 Å, and still more preferably 500 Å to 900 Å in view of a balance with the transparent oxide layer. The thickness may be 700 Å to 900 Å or 400 Å to 900 Å.

In the case where the film thickness of the carbon layer is too thin, reflection properties may be impaired. In the case where the film thickness of the carbon layer is too thick, low electrical conductivity of the carbon layer may prevent an electrical contact, and poor transparency may decrease an amount of incident light into a backside layer due to absorption loss.

In addition, in the case where the carbon layer is formed by using a vapor deposition method or a sputtering method, a film with high quality may be obtained by previously containing hydrogen, methane, or carbon dioxide. The carbon layer according to the present invention preferably has a refractive index of 1.25 or more and 1.90 or less against light with a wavelength of 600 nm. The refractive index is more preferably 1.25 or more and 1.80 or less, and particularly preferably 1.35 or more and 1.90 or less.

The reason therefor is that the carbon layer having a lower refractive index than the transparent oxide layer allows more excellent reflection properties as an intermediate reflecting layer. This interlayer 4 is an inactive layer contributing to no photoelectric conversion and light absorbed therein scarcely contributes to electric power generation, so that the interlayer 4 is preferably thinned as much as possible and lower refractive index is advantageous thereto. The carbon layer needs to have electrical conductivity, and it is important for forming a photoelectric conversion device with high properties to have electrical conductivity and offer lower refractive index.

The reason why a value in light with a wavelength of 600 nm is regarded as an indicator for a refractive index of the carbon layer herein is as follows. In a hybrid photoelectric conversion device as one of stacked photoelectric conversion devices, in which an amorphous silicon-based photoelectric conversion unit and a crystalline silicon-based photoelectric conversion unit are stacked, the falling edge of spectral sensitivity current of the amorphous silicon-based photoelectric conversion unit and the rising edge of spectral sensitivity current of the crystalline silicon-based photoelectric conversion unit are crossed at a wavelength around 600 nm.

Thus, a film which favorably reflects light of around 600 nm, that is, a film having a low refractive index against light of 600 nm may attain excellent reflection properties in selectivity so easily, and may be appropriate for increasing current generation in the front photoelectric conversion unit. The refractive index may be evaluated by using a spectroscopic ellipsometry method, for example. Specifically, the refractive index is obtained by fitting the measurement result by a spectroscopic ellipsometer VASE (manufactured by J. A. Woollam Co., Inc).

When the interlayer has n pairs of layers, wherein a combination of a carbon layer and a transparent oxide layer stacked in this order behind the first transparent oxide layer is regarded as a pair of layers, the stacking number n is preferably 2 or more, particularly preferably 2 to 5. If the stacking number n is larger than the above mentioned, stress resistance may be improved but wavelength-selectivity may not be improved; further, a loss of light, which attributes to light trapping in the transparent oxide layer as a high refractile body in the interlayer, tends to increase remarkably. When wavelength-selectivity, stress resistance and absorption loss are considered, the stacking number of 2 to 3 is more preferable in view of a balance as the interlayer incorporated into the photoelectric conversion unit.

The total thickness of the transparent oxide layer being stacked together is preferably 40 Å or more and 4000 Å or less, more preferably 100 Å or more and 2000 Å or less, even more preferably 100 Å or more and 1000 Å or less, and particularly preferably 200 Å or more and 500 Å or less. The total thickness of the carbon layer is preferably 200 Å or more and 4000 Å or less, more preferably 300 Å or more and 2000 Å or less, even more preferably 400 Å or more and 1500 Å or less, and particularly preferably 500 Å or more and 1000 Å or less.

In the present invention, wherein a transparent conductive film, at least one photoelectric conversion unit, a transparent electrode layer having electrical conductivity, a hard carbon layer having electrical conductivity, and a high reflecting electrode layer are stacked in this order presented on a side opposite to the light incidence side of a transparent insulating substrate located light incidence side, the photoelectric conversion device may have the following configuration.

Figure 6:
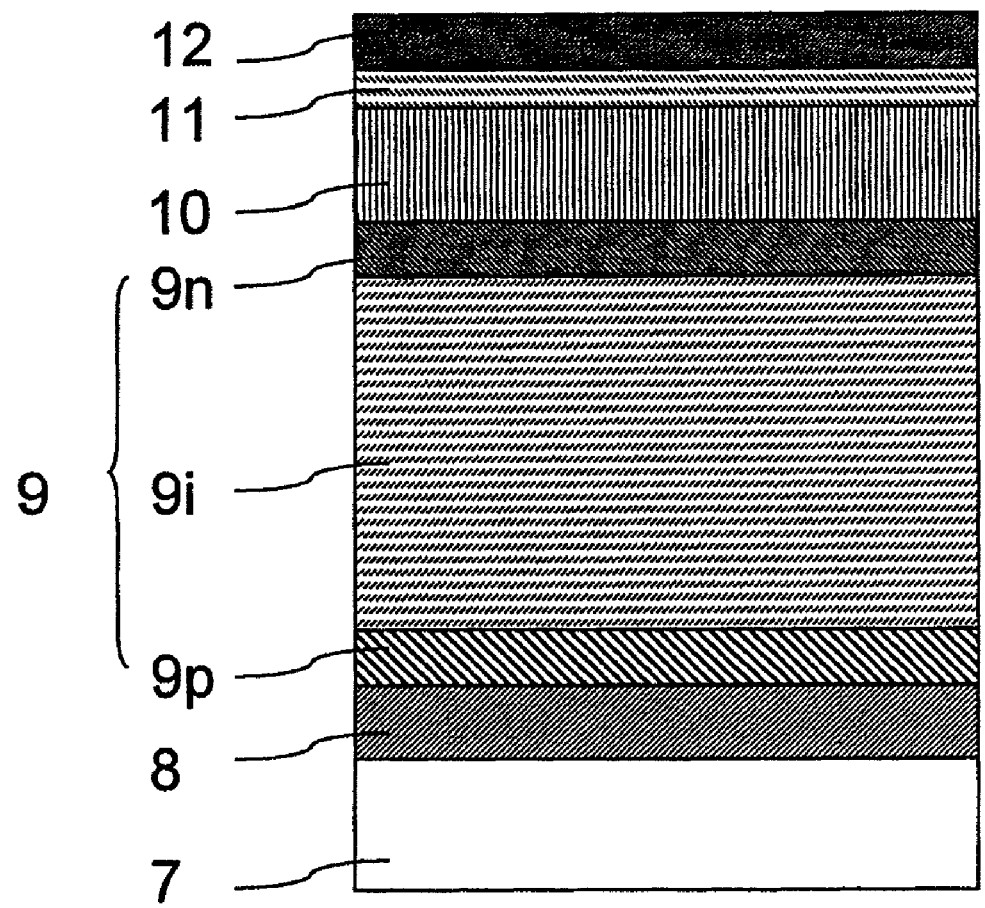
FIG. 6 is a schematic cross-sectional view of an amorphous silicon solar cell according to the present invention.

Referring to FIG. 6, an amorphous silicon solar cell as an embodiment of the present invention is hereinafter described. A transparent conductive film 8 is formed on a transparent insulating substrate 7. As the transparent insulating substrate 7, a tabular member or a sheet-like member made of glass, transparent resin or the like may be used. Metallic oxides such as tin oxide and zinc oxide may be used for the transparent conductive film 8, which may be formed by using methods such as CVD, sputtering and vapor deposition. The transparent conductive film 8 may have the effect of increasing the scattering of incident light by causing minute irregularities on the surface thereof through a contrivance of the forming conditions.

The haze ratio may be approximately 5 to 30% and the sheet resistance may be approximately 5 to 20Ω/□. An amorphous silicon photoelectric conversion unit 9 is formed on the transparent conductive film 8. The amorphous silicon photoelectric conversion unit 9 may be formed of an amorphous p-type silicon carbide layer 9$p$, an amorphous i-type silicon photoelectric conversion layer 91, and an n-type silicon layer 9$n$. The materials for the amorphous i-type silicon photoelectric conversion layer 91 may include not merely silicon but also band gap adjustment elements such as carbon and germanium. The n-type silicon layer 9$n$ may be amorphous or crystalline, or may contain elements such as oxygen, nitrogen and carbon.

A high-frequency plasma enhanced CVD method is appropriate for forming the amorphous silicon photoelectric conversion unit 9. The forming conditions preferably used are a substrate temperature of 100 to 250° C., a pressure of 30 to 1500 Pa, and a high-frequency power density of 0.01 to 0.5 W/cm$^2$. Examples of raw material gas used for forming the photoelectric conversion unit include silicon-containing gases such as $SiH_4$ and $Si_2H_6$, or a mixture of the gases and hydrogen.

Preferable examples of dopant gas for forming the p-type or n-type layer in the photoelectric conversion unit include $B_2H_6$ or $PH_3$. Carbon dioxide or ammonia in addition to the above-mentioned gases is preferably used in the case of containing oxygen or nitrogen element in the n-type layer.

A transparent electrode layer 10 is formed on the n-type silicon layer 9$n$. The transparent electrode layer 10 may allow sufficient adhesion properties between the amorphous silicon photoelectric conversion unit 9 and a high reflecting electrode layer 12, and maintain denseness of the film. Thus, diffusion of a metallic material from the high reflecting electrode layer 12 and infusion into the amorphous silicon photoelectric conversion unit 9 may be prevented. In addition, when a transparent electrode layer 10 is formed, the optimum reflection properties may be obtained in optical reflection at a back face electrode.

Tin oxide, zinc oxide, ITO or the like may be used for the transparent electrode layer 10, and zinc oxide is preferable among them. The reason therefor is that zinc oxide is abundant as a natural resource and thus inexpensive, shows high transmittance, and is excellent as a diffusion prevention layer.

A forming method therefor is not particularly limited as long as a uniform thin film is formed. Examples thereof include PVD methods such as sputtering and vapor deposition, chemical vapor phase methods such as various kinds of CVD methods, and a method for forming the transparent electrode layer by heat treatment after applying solution containing raw materials for the transparent electrode layer by a spin coat method, a roll coat method, spray coating, and dip coating or the like. Chemical vapor phase methods are preferable from the viewpoint that a thin film at the nanometer level is easily formed.

The film thickness of the transparent electrode is preferably 50 Å or more and 5000 Å or less, desirably 120 Å or more and 1500 Å or less, and more desirably 150 Å or more and 900 Å or less.

In the case where the film thickness of the transparent electrode layer is too thin, electrical conductivity of the transparent electrode layer is so extremely low that an effective transparent conductive film may not obtained. In the case where the film thickness of the transparent electrode layer is too thick, transparency may be impaired and production cost may be raised.

A hard carbon layer 11 is formed on the transparent electrode layer 10. The above-mentioned hard carbon layer 11 is not particularly limited as long as it is formed of components made mainly of a carbon atom; examples thereof include diamond-like carbon, graphite-like carbon, carbon nanotubes, and fullerenes. Among them, diamond-like carbon is preferable by reason of being high in electrical conductivity, high in transparency and excellent in productivity.

Diamond-like carbon may be produced by generally known methods, such as a plasma enhanced CVD method, a vapor deposition method, and a sputtering method, any of which may be used. In the case where the hard carbon layer is formed by a plasma enhanced CVD method, ordinarily used raw materials may be used and examples of a carbon source include methane and benzene; for example, a favorable hard carbon film may be obtained by a method where methane, or methane and hydrogen is used.

A fluorine atom may be introduced for improving stability of a transparent electrode layer surface. Tetrafluoromethane, trifluoromethane, difluoromethane, fluoromethane, and fluorine-substituted benzene may be used as a carbon source when the fluorine atom is introduced. Methane may be diluted with hydrogen or not. In the case where methane concentration is low due to hydrogen dilution, the film forming rate may become so low that a productivity may be reduced, but transparency is increased.

In the case where methane concentration is high without performing dilution, the ratio of a carbon atom with a graphite structure in the film may be increased to impair transparency. The methane concentration may be 0.5% by volume or more for these reasons.

The power of the plasma is not particularly limited, preferably 10 W to 600 W. When the power is too low, film may not be formed. On the other hand, when the plasma power is too high, the transparent electrode layer 10 may be etched by plasma. The film thickness of the hard carbon layer 11 may be 5 Å to 2000 Å. The film thickness is preferably 600 Å to 1800 Å, and more preferably 400 Å to 1500 Å in view of the properties of the transparent conductive layer. When the film thickness is too thin, a stabilization of a transparent electrode layer surface may not be achieved, and in such a case, the effect of reducing absorption loss on a high reflecting electrode layer interface may be decreased.

When the hard carbon layer has small thickness and shows low electrical conductivity, an electrical contact may be prevented and a transparency may be impaired. In the case where the hard carbon layer is formed by using a vapor deposition method or a sputtering method, a favorable diamond-like carbon film may be obtained by adding hydrogen in advance.

A metal layer made of Ag, Al or an alloy thereof may be formed as the high reflecting electrode layer 12 by methods such as a sputtering method or a vapor deposition method.

The above description is made for a monolayer type solar cell of only an amorphous silicon photoelectric conversion unit, and may be performed for a monolayer type solar cell of only a crystalline silicon photoelectric conversion unit, or a hybrid stacked solar cell such that an amorphous silicon photoelectric conversion unit and a crystalline silicon photoelectric conversion unit are stacked.

A three-junction solar cell, such that a crystalline silicon photoelectric conversion unit is further stacked on an amorphous silicon photoelectric conversion unit and a crystalline silicon photoelectric conversion unit, may be offered. In addition, a material other than silicon, such as copper indium gallium selenide (CIGS) and cadmium tellurium (CdTe), may be contained as the main component of the photoelectric conversion unit.

EXAMPLES

Examples of a method for producing a multi-junction silicon-based photoelectric conversion device including stacked structures corresponding to the above-mentioned embodiments, while comparing with Comparative Examples, are hereinafter described in detail. As the Examples, super-straight-type multi-junction silicon-based photoelectric conversion devices each having a two-stacked-type structure are illustrated, such that an amorphous silicon photoelectric conversion unit and a crystalline silicon photoelectric conversion unit are stacked. Same Reference numerals refer to similar elements in the Figures, and duplicated descriptions are omitted. The present invention is not limited to the following Examples unless it departs from the scope thereof.

Example 1

A multi-junction silicon solar cell of Example 1, which corresponds to a first embodiment described with reference to FIG. 1, was produced. Glass was used for a transparent substrate 1 and $SnO_2$ was used for a transparent electrode layer 2. The film thickness of the transparent electrode layer 2 was 800 nm, the sheet resistance was 10Ω/□, and the haze ratio was 15 to 20%. A boron-doped p-type silicon carbide (SiC) layer, an undoped amorphous silicon photoelectric conversion layer, and a phosphorus-doped n-type µc-Si layer having thicknesses of 10 nm, 300 nm, and 20 nm, respectively were formed thereon by a plasma enhanced CVD method. Thus, a pin junction amorphous silicon photoelectric conversion unit 3 as a front photoelectric conversion unit was formed.

Further, an interlayer 4 was formed on the amorphous silicon photoelectric conversion unit 3. First, a substrate with the amorphous silicon photoelectric conversion unit 3 formed was taken out of the plasma enhanced CVD device into the air. Thereafter, the substrate was placed in a film-forming chamber of a sputtering device for forming a transparent oxide layer 4a made of zinc oxide by a sputtering method. In the formation of zinc oxide by a DC sputtering method, 2-wt % Al was added to zinc oxide as a sputtering target, Ar gas was introduced as sputtering gas, the substrate was heated to a temperature of 150° C., and the pressure was 0.27 Pa to form zinc oxide having a film thickness of 100 Å. A refractive index of the zinc oxide layer 4a was measured by a spectroscopic ellipsometry method, and was determined to be 2.10 at a wavelength of 600 nm.

The substrate with the transparent oxide layer 4a formed was taken out of the film-forming chamber into the air, and thereafter placed in a plasma enhanced CVD device for forming a carbon layer 4b by a CVD method. A carbon film having a film thickness of 800 Å was formed by using a plasma enhanced CVD device. Methane of 50 sccm (a methane concentration of 100% by volume) was used as a raw material, a substrate temperature was 150° C. and a discharge power was 200 W. A refractive index of the zinc oxide carbon layer 4b was measured by a spectroscopic ellipsometry method, and was determined to be 1.40 at a wavelength of 600 nm. In addition, the spectrum of the carbon layer was measured by using an FT-IR spectrometer.

A peak derived from C—H stretching vibration was observed at approximately 2920 cm$^{-1}$ in the spectrum, so that it was confirmed that hydrogen was contained in the film. Then, the substrate with the carbon layer 4b formed was taken out of the plasma enhanced CVD device into the air, and thereafter placed in a sputtering device to form a zinc oxide layer having a film thickness of 150 Å as a transparent oxide layer 4c by the same DC sputtering method.

Then, the substrate with the above-mentioned interlayer 4 formed was taken out of the film-forming chamber into the air, and placed in a plasma enhanced CVD device. Then, a boron-doped p-type microcrystalline silicon layer, an undoped crystalline silicon photoelectric conversion layer, and a phosphorus-doped n-type microcrystalline silicon layer having thicknesses of 15 nm, 2.5 and 20 nm, respectively, were formed on the interlayer 4 by a plasma enhanced CVD method. Thus, a pin junction crystalline silicon photoelectric conversion unit 5 as a back photoelectric conversion unit was formed. Further, A ZnO film having a thickness of 80 nm and an Ag film having a thickness of 300 nm were formed as a back face electrode layer 6 on the back photoelectric conversion unit 5 by a sputtering method.

Figure 4:
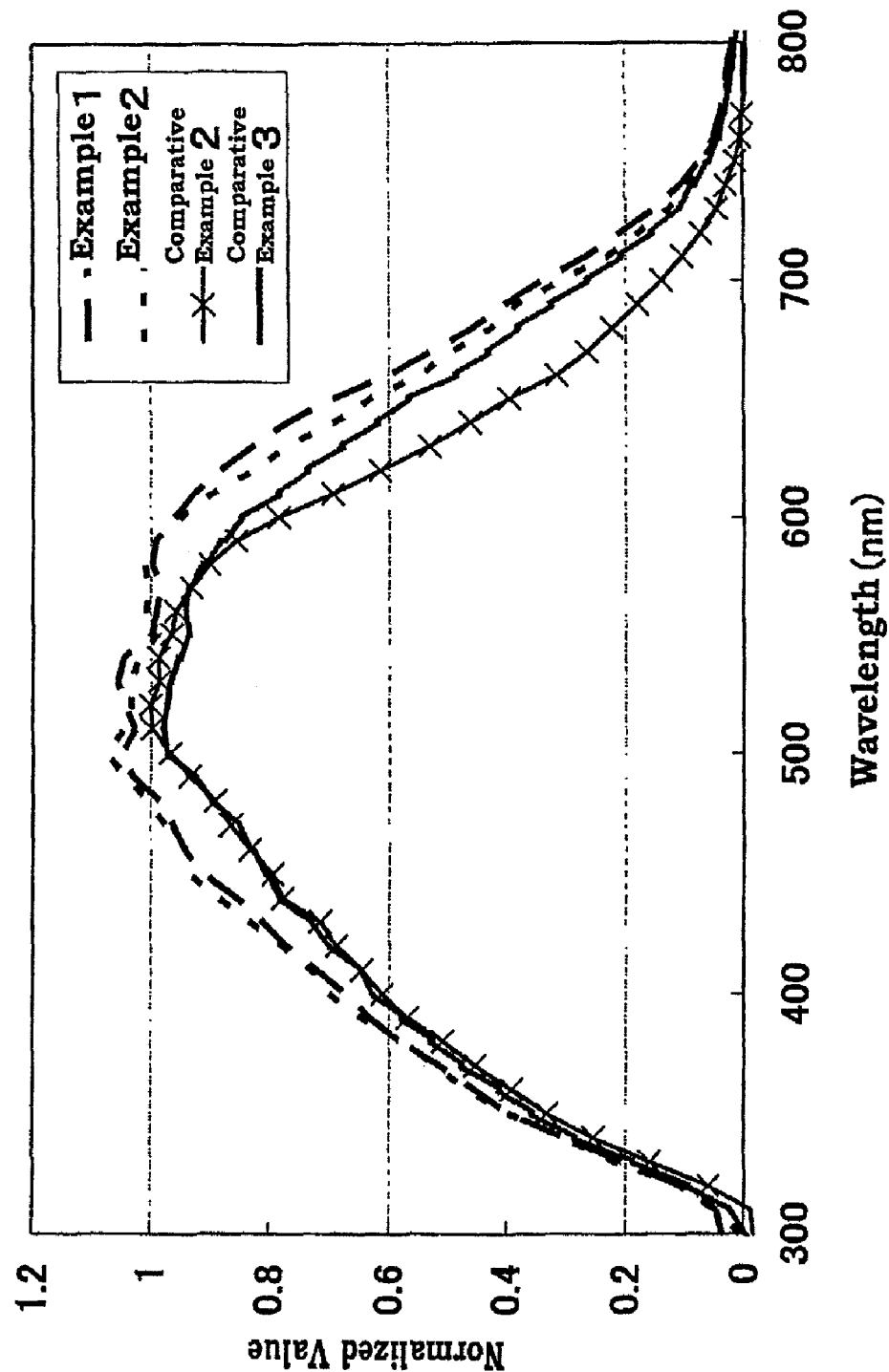
FIG. 4 shows spectral sensitivity characteristics of photoelectric conversion devices in the present invention.

A photoelectric conversion unit with a light-receptive area 1 cm square was separated from the multi-function silicon solar cell obtained as described above and a spectral sensitivity was measured so that the incident light amount into the front photoelectric conversion unit was evaluated. The result is shown in FIG. 4. The graph is shown by using normalized value wherein the value of the maximum sensitivity in the after-mentioned results of Comparative Example 2 is regarded as 1. The spectral sensitivity current was calculated as 14.5 mA/cm$^2$ by the sensitivity spectrum. The summary of the spectral sensitivity current is Table 1.

Example 2

A multi-junction silicon solar cell of Example 2, which corresponds to a first embodiment described with reference to FIG. 1, was produced. The solar cell of Example 2 corresponds to a first embodiment described by referring to FIG. 1. Glass was used for a transparent substrate 1 and SnO$_2$ was used for a transparent electrode layer 2. The film thickness of the transparent electrode layer 2 was 800 nm, the sheet resistance was 10Ω/□, and the haze ratio was 15 to 20%.

A boron-doped p-type silicon carbide (SiC) layer, an undoped amorphous silicon photoelectric conversion layer, and a phosphorus-doped n-type μc-Si layer having thicknesses of 10 nm, 300 nm, and 20 nm, respectively were formed thereon by a plasma enhanced CVD method. Thus, a pin junction amorphous silicon photoelectric conversion unit 3 as a front photoelectric conversion unit was formed.

Further, an interlayer 4 was formed on the amorphous silicon photoelectric conversion unit 3. First, a substrate with the amorphous silicon photoelectric conversion unit 3 formed was not taken out into the air and a transparent oxide layer 4a made of a conductive oxygenated silicon layer was formed in the plasma enhanced CVD device. The forming conditions of the conductive oxygenated silicon layer were a plasma excitation frequency of 13.56 MHz, a substrate temperature of 150° C., a reaction chamber pressure of 666 Pa and a discharge power of 200 W.

SiH$_4$/PH$_3$/CO$_2$/H$_2$ as raw material gas introduced into the plasma enhanced CVD reaction chamber was used at a flow ratio of 10/0.2/30/1000 sccm. The conductive oxygenated silicon layer 4a having a film thickness of 100 Å was formed in the above-mentioned conditions. A refractive index of the conductive oxygenated silicon layer 4a was measured by a spectroscopic ellipsometry method, and was determined to be 1.95 at a wavelength of 600 nm.

Thereafter, the substrate was not taken out of the film-forming chamber into the air, and a carbon layer 4b was formed by using a plasma enhanced CVD device. A carbon film having a thickness of 800 Å was formed by using a plasma enhanced CVD device. Methane of 50 sccm (a methane concentration of 100% by volume) was used as a raw material, a substrate temperature was 150° C. and a discharge power was 200 W. A refractive index of the zinc oxide carbon layer 4b was measured by a spectroscopic ellipsometry method, and was determined to be 1.40 at a wavelength of 600 nm. The substrate with the carbon layer 4b formed was not taken out of the plasma enhanced CVD device into the air, and a conductive oxygenated silicon layer having a film thickness of 150 Å as a transparent oxide layer 4c was formed by a plasma enhanced CVD method.

Then, the substrate with the above-mentioned interlayer 4 formed was not taken out of the film-forming chamber into the air, and a boron-doped p-type microcrystalline silicon layer, an undoped crystalline silicon photoelectric conversion layer, and a phosphorus-doped n-type microcrystalline silicon layer having thicknesses of 15 nm, 2.5 μm, and 20 nm, respectively were formed on the above-mentioned interlayer

TABLE 1

| Spectral sensitivity current (mA/cm$^2$) | Example 1 | Example 2 | Example 3 | Comparative Example 1 | Comparative Example 2 | Comparative Example 3 | Comparative Example 4 |
|---|---|---|---|---|---|---|---|
| | 14.5 | 14.4 | 13.3 | immeasurable | 11.4 | 12.4 | 12.3 |

4 by a plasma enhanced CVD method. Thus, a pin junction crystalline silicon photoelectric conversion unit 5 as a back photoelectric conversion unit was formed.

Further, a ZnO film having a thickness of 80 nm and an Ag film having a thickness of 300 nm were formed as a back face electrode layer 6 on the back photoelectric conversion unit 5 by a sputtering method. A photoelectric conversion unit with a light-receptive area 1 cm square was separated from the multi-junction silicon solar cell obtained as described above and a spectral sensitivity was measured so that the incident light amount into the front photoelectric conversion unit was evaluated. The result is shown in FIG. 4. The spectral sensitivity current was calculated as 14.4 mA/cm$^2$ from the sensitivity spectrum. The summary of the spectral sensitivity current is shown in Table 1.

Example 3

A multi-junction thin-film silicon solar cell with a configuration shown in FIG. 1 was produced as Example 3. This Example was different from Example 1 only in the forming conditions of the carbon layer 4b in the interlayer 4. More specifically, in the Example 3, the substrate was placed in a plasma enhanced CVD device for forming a carbon layer 4b by a CVD method. A carbon film having a film thickness of 1000 Å was formed by using a plasma enhanced CVD device. Methane of 10 sccm (a methane concentration of 100% by volume) and hydrogen of 200 sccm were used as a raw material, a substrate temperature was 150° C., and a discharge power was 200 W.

A refractive index of the carbon layer 4b was measured by a spectroscopic ellipsometry method, and was determined to be 1.90 at a wavelength of 600 nm. In addition, the spectrum of the carbon layer was measured by using an FT-IR spectrometer. A peak derived from C—H stretching vibration was observed at approximately 2920 cm$^{-2}$ in the spectrum, so that it was confirmed that hydrogen was contained in the film. Then, the substrate with the carbon layer 4b formed was taken out of the plasma enhanced CVD device into the air, and thereafter placed in a sputtering device to form a zinc oxide layer having a film thickness of 150 Å as a transparent oxide layer 4c by the same DC sputtering method.

Subsequently, the substrate was taken out of the film-forming chamber into the air, and placed in a film-forming chamber of a CVD device. Then, a crystalline silicon photoelectric conversion unit 5 was formed by the same method. A back face electrode layer 6 was further formed on the crystalline silicon photoelectric conversion unit 5.

Spectral sensitivity characteristics were measured by the same method as in Example 1, and the spectral sensitivity current was calculated as 13.3 mA/cm$^2$ from the sensitivity spectrum. The results are summarized in Table 1.

Comparative Example 1

Figure 2:
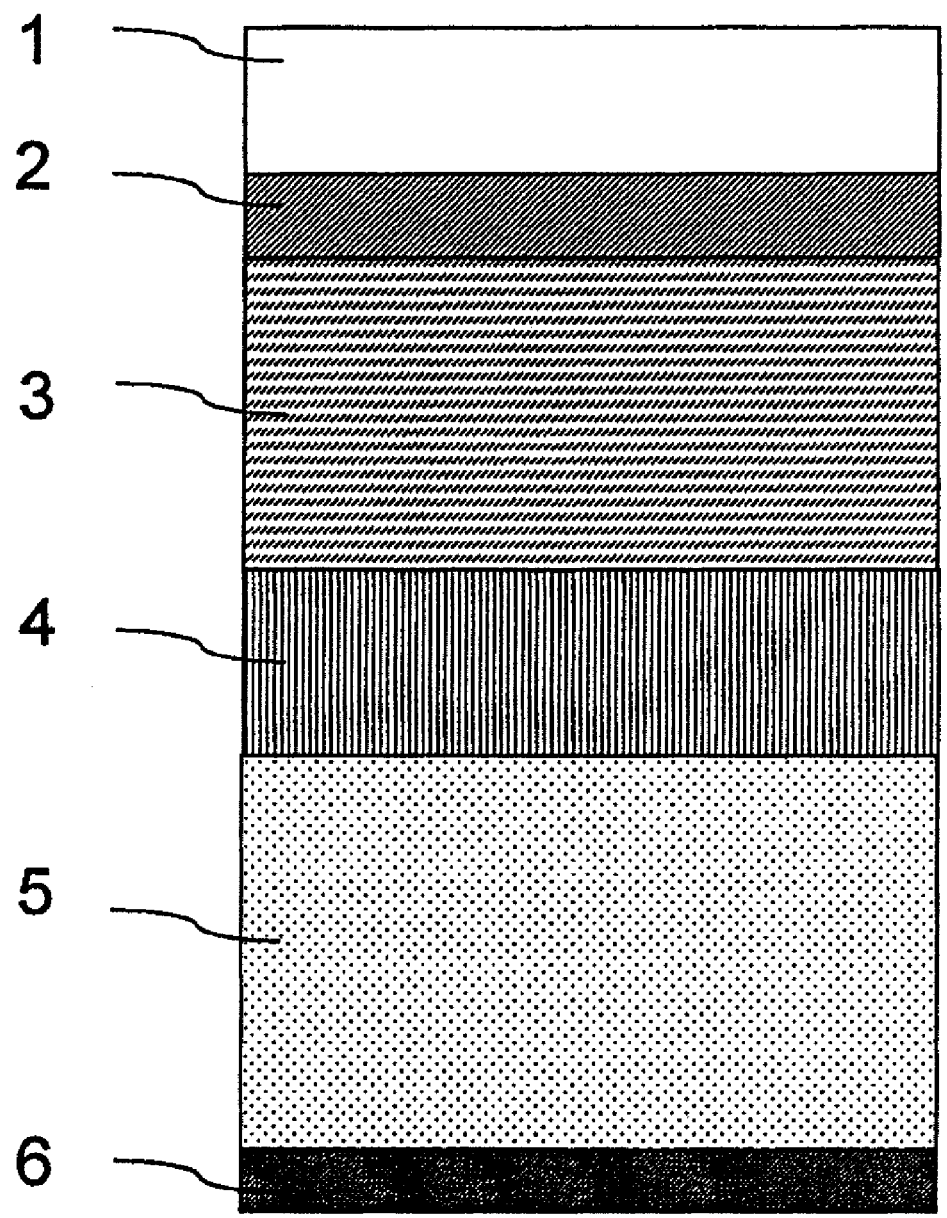
FIG. 2 is a structure cross-sectional view of a photoelectric conversion device in Comparative Examples.

A multi-junction thin-film silicon solar cell with a configuration shown in FIG. 2 was produced as Comparative Example 1. This case was different from Examples 1 and 2 only in that the interlayer 4 comprises only a carbon layer. More specifically, in the Comparative Example 1, an amorphous silicon photoelectric conversion unit 3 was formed and thereafter the substrate was not taken out of the film-forming chamber into the air, and an interlayer 4 made only of a carbon layer having a film thickness of 800 Å was formed. Then, the substrate was not taken out of the film-forming chamber into the air, and a crystalline silicon photoelectric conversion unit 5 was formed by the same method. A back face electrode layer 6 was further formed on the crystalline silicon photoelectric conversion unit 5.

Then, a spectral sensitivity characteristic was measured by the same method, but the solar cell of Comparative Example 2 did not operate as a photoelectric conversion device. The cause thereof is conceived to be that the carbon layer does not form ohmic contact with the photoelectric conversion unit and series resistance becomes so high as to be incapable of forming a series connection. Therefore, it was confirmed by the present invention that the insertion of the conductive transparent oxide layer the in front of and behind the carbon layer allowed electrical connection.

Comparative Example 2

Figure 3:
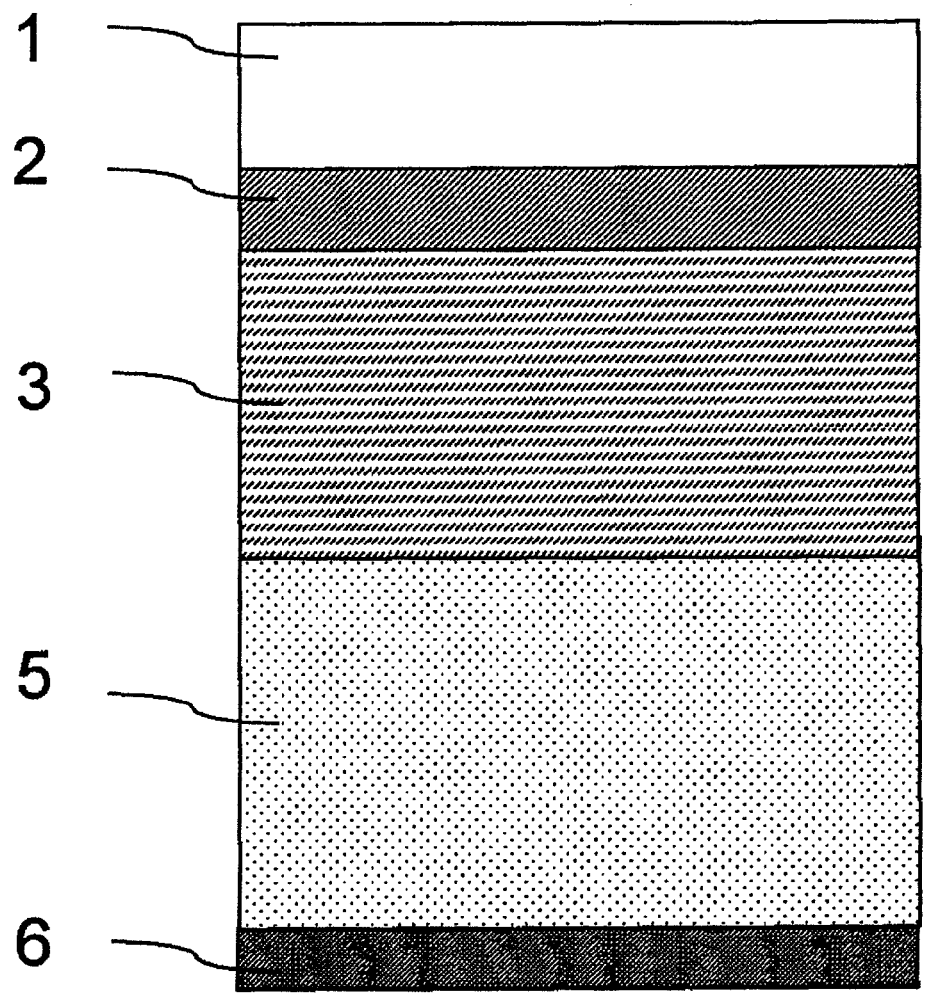
FIG. 3 is a structure cross-sectional view of a photoelectric conversion device in Comparative Examples.

A multi-junction thin-film silicon solar cell with the configuration shown in FIG. 3 was produced as Comparative Example 2. This case was different from Examples 1 and 2 only in that the interlayer 4 was not inserted.

Spectral sensitivity characteristics thereof were measured, and the results are shown in FIG. 4. From the sensitivity spectrum, the spectral sensitivity current was calculated to be 11.4 mA/cm$^2$. The results are summarized in Table 1.

Through the above results, the spectral sensitivity current of Example 1 was 14.5 mA/cm$^2$ and the spectral sensitivity current of Example 2 was 14.4 mA/cm$^2$, so that it was confirmed by the present invention that the spectral sensitivity current was improved by approximately 27% as compared with the case of no interlayer. On the other hand, the spectral sensitivity current of Example 3 was 13.3 mA/cm$^2$, so that it was confirmed that the higher refractive index of the carbon layer decreased an increment in the current.

Comparative Example 3

A multi-junction thin-film silicon solar cell with the configuration shown in FIG. 2 was produced as Comparative Example 3. This case was different from Examples 1 and 2 only in that the interlayer 4 comprises only a zinc oxide layer. More specifically, in the Comparative Example 3, an amorphous silicon photoelectric conversion unit 3 was formed and thereafter the substrate was taken out of the film-forming chamber into the air and placed in a film-forming chamber of a sputtering device. Then, an interlayer 4 made only of a zinc oxide layer having a film thickness of 800 Å was formed.

A refractive index of the zinc oxide layer was measured by a spectroscopic ellipsometry method, and was determined to be 2.10 at a wavelength of 600 nm.

Subsequently, the substrate was taken out of the film-forming chamber into the air, and placed in a film-forming chamber of a CVD device. Then, a crystalline silicon photoelectric conversion unit 5 was formed by the same method. A back face electrode layer 6 was further formed on the crystalline silicon photoelectric conversion unit 5.

Spectral sensitivity characteristics were measured by the same method, and the results are shown in FIG. 4. From the sensitivity spectrum, the spectral sensitivity current was calculated as 12.4 mA/cm$^2$. The results are summarized in Table 1.

Through the above results, the spectral sensitivity current of Example 1 was 14.5 mA/cm$^2$ and the spectral sensitivity current of Example 2 was 14.4 mA/cm$^2$, so that the spectral sensitivity current was improved by approximately 17% by the present invention. Therefore, it was confirmed that an interlayer having excellent reflection properties was formed by using the carbon layer with low refractive index in an interlayer.

On the other hand, the spectral sensitivity current of Example 3 was 13.3 mA/cm², so that it was confirmed that higher refractive index of the carbon layer decreased the increment in the current.

Comparative Example 4

A multi-junction thin-film silicon solar cell with a configuration shown in FIG. 2 was produced as Comparative Example 4. This case was different from Examples 1 and 2 only in that the interlayer 4 comprises only a conductive oxygenated silicon layer. More specifically, in the Comparative Example 4, an amorphous silicon photoelectric conversion unit 3 was formed and thereafter the substrate was not taken out of the film-forming chamber into the air, and an interlayer 4 made only of a conductive oxygenated silicon layer having a film thickness of 800 Å was formed. A refractive index of the conductive oxygenated silicon layer oxide layer was measured by a spectroscopic ellipsometry method, and was determined to be 1.95 at a wavelength of 600 nm.

Then, the substrate was not taken out of the film-forming chamber into the air, and a crystalline silicon photoelectric conversion unit 5 was formed by the same method. A back face electrode layer 6 was further formed on the crystalline silicon photoelectric conversion unit 5. A spectral sensitivity characteristic was measured by the same method, and the spectral sensitivity current was calculated as 12.3 mA/cm² from the sensitivity spectrum. The results are summarized in Table 1.

Through the above results, the spectral sensitivity current of Example 1 was 14.5 mA/cm² and the spectral sensitivity current of Example 2 was 14.4 mA/cm², so that the spectral sensitivity current was improved by approximately 17% by the present invention. Therefore, it was confirmed that an interlayer having excellent reflection properties was formed by using the carbon layer with low refractive index in an interlayer. On the other hand, the spectral sensitivity current of Example 3 was 13.3 mA/cm², so that it was confirmed that higher refractive index of the carbon layer decreased the increment in the current.

Example 4

A multi-junction silicon solar cell of Example 4, which was described with reference to FIG. 5, was produced. Glass was used for a transparent substrate 1 and SnO₂ was used for a transparent electrode layer 2. The film thickness of the transparent electrode layer 2 was 800 nm, the sheet resistance was 10Ω/□, and the haze ratio was 15 to 20%. A boron-doped p-type silicon carbide (SiC) layer, an undoped amorphous silicon photoelectric conversion layer, and a phosphorus-doped n-type μc-Si layer having thicknesses of 100 Å, 2000 Å, and 200 Å, respectively were formed thereon by a plasma enhanced CVD method.

Thus, a pin junction amorphous silicon photoelectric conversion unit 3 as a front photoelectric conversion unit was formed. In addition, an interlayer 4 was formed on the amorphous silicon photoelectric conversion unit 3. First, a transparent oxide layer 4a made of zinc oxide was formed by a sputtering method. Here, 2-wt % Al was added to zinc oxide as a sputtering target, Ar gas was introduced as sputtering gas, the substrate was heated to a temperature of 150° C., and the pressure was 0.27 Pa to form zinc oxide having a film thickness of 150 Å by a DC sputtering method.

A refractive index of the zinc oxide layer 4a was measured by a spectroscopic ellipsometry method, and was determined to be 2.1 at a wavelength of 600 nm.

Next, a carbon layer 4b was formed by a CVD method. A carbon film having a thickness of 400 Å was formed by using a plasma enhanced CVD device. Methane of 50 sccm (a methane concentration of 100% by volume) was used as a raw material, a substrate temperature was 150° C. and a discharge power was 0.27 W/cm². A refractive index of the carbon layer 4b was measured by a spectroscopic ellipsometry method, and was determined to be 1.5 at a wavelength of 600 nm.

Next, a zinc oxide layer as a transparent oxide layer 4c having a film thickness of 75 Å was formed by the same method as that in the zinc oxide layer 4a, and a carbon layer 4d having a film thickness of 400 Å was formed by the same method as that in the carbon layer 4b was formed. Further, a zinc oxide layer having a film thickness of 75 Å was formed as a transparent oxide layer 4e. Then, a boron-doped p-type microcrystalline silicon layer, an undoped crystalline silicon photoelectric conversion layer, and a phosphorus-doped n-type microcrystalline silicon layer having thicknesses of 150 Å, 35000 Å, and 200 Å, respectively, were formed on the above-mentioned interlayer 4 by a plasma enhanced CVD method.

Thus, a pin junction crystalline silicon photoelectric conversion unit 5 as a back photoelectric conversion unit was formed. Further, a ZnO film having a thickness of 800 Å and an Ag film having a thickness of 2500 Å were formed as a back face electrode layer 6 on the back photoelectric conversion unit 5 by a sputtering method.

A photoelectric conversion unit with a light-receptive area of 1 square cm was separated from the multi-junction silicon solar cell obtained as described above and a spectral sensitivity was measured so that the incident light amount into the front photoelectric conversion unit was evaluated. The spectral sensitivity current was 14.3 mA/cm² in the front photoelectric conversion unit and 14.0 mA/cm² in the back photoelectric conversion unit. The controlled current is 14.0 mA/cm² since the front and the back photoelectric conversion units are connected in series. A summary of the spectral sensitivity current is shown in Table 2.

TABLE 2

|  | Front photoelectric conversion unit (mA/cm²) | Back photoelectric conversion unit (mA/cm²) | Total current (mA/cm²) | Controlled current (mA/cm²) | Refractive index carbon layer |
|---|---|---|---|---|---|
| Example 4 | 14.3 | 14.0 | 28.3 | 14.0 | 1.5 |
| Example 5 | 14.8 | 12.6 | 27.4 | 12.6 | 1.7 |
| Example 5-1 | 14.2 | 13.6 | 27.8 | 13.6 | 1.5 |
| Example 5-2 | 14.6 | 12.5 | 27.1 | 12.5 | 1.7 |
| Comparative Example 5 | 12.6 | 12.4 | 25.0 | 12.4 |  |

Example 5

A multi-junction silicon solar cell of Example 5, which was described with reference to FIG. 5, was produced. This case differs from Example 4 in that a discharge power in forming the carbon layer was 0.22 W/cm$^2$ and a refractive index of the carbon layer was 1.7 at a wavelength of 600 nm. When a spectral sensitivity characteristic was measured, the spectral sensitivity current was 14.8 mA/cm$^2$ in the front photoelectric conversion unit and 12.6 mA/cm$^2$ in the back photoelectric conversion unit. The controlled current is 12.6 mA/cm$^2$ since the front and the back photoelectric conversion units are connected in series. Summary of the spectral sensitivity current is shown in Table 2.

Example 5-1

A multi-junction thin-film silicon solar cell with the configuration shown in FIG. 1 was produced as Example 5-1. An amorphous silicon photoelectric conversion unit 3 was formed and a zinc oxide layer as a transparent oxide layer 4a having a film thickness of 150 Å was formed thereafter by the same method as that in Example 4. Next, a carbon layer 4b having a film thickness of 800 Å was formed by the same method as that in Example 4. When the carbon layer 4b was measured by a spectroscopic ellipsometry method, a refractive index was 1.5 at a wavelength of 600 nm. A zinc oxide layer as a transparent oxide layer 4c having a film thickness of 150 Å was further formed thereon by the same method as that in Example 4.

Then, a crystalline silicon photoelectric conversion unit 5 was formed by the same method as that in Example 4. A back face electrode layer 6 was further formed on the crystalline silicon photoelectric conversion unit 5 by the same method as that in Example 4. When a spectral sensitivity characteristic was measured, the spectral sensitivity current was 14.2 mA/cm$^2$ in the front photoelectric conversion unit and 13.6 mA/cm$^2$ in the back photoelectric conversion unit. The controlled current is 13.6 mA/cm$^2$ since the front and the back photoelectric conversion units are connected in series. A summary of the spectral sensitivity current is shown in Table 2.

Example 5-2

A multi-junction thin-film silicon solar cell with the configuration shown in FIG. 1 was produced as Example 5-2. An amorphous silicon photoelectric conversion unit 3 was formed and a zinc oxide layer as a transparent oxide layer 4a having a film thickness of 150 Å was formed thereafter by the same method as that in Example 5. Next, a carbon layer 4b having a film thickness of 800 Å was formed by the same method as that in Example 4. When the carbon layer 4b was measured by a spectroscopic ellipsometry method, a refractive index was 1.7 at a wavelength of 600 nm. A zinc oxide layer as a transparent oxide layer 4c having a film thickness of 150 Å was further formed thereon by the same method as that in Example 4.

Then, a crystalline silicon photoelectric conversion unit 5 was formed by the same method as that in Example 4. A back face electrode layer 6 was further formed on the crystalline silicon photoelectric conversion unit 5 by the same method as that in Example 4. When a spectral sensitivity characteristic was measured, the spectral sensitivity current was 14.6 mA/cm$^2$ in the front photoelectric conversion unit and 12.5 mA/cm$^2$ in the back photoelectric conversion unit. The controlled current is 12.5 mA/cm$^2$ since the front and the back photoelectric conversion units are connected in series. A summary of the spectral sensitivity current is shown in Table 2.

Comparative Example 5

A multi-junction thin-film silicon solar cell with the configuration shown in FIG. 2 was produced as Comparative Example 5. This case was different from Examples 5, 5-1 and 5-2 only in that the interlayer 4 comprises only a zinc oxide layer. That is, an amorphous silicon photoelectric conversion unit 3 was formed and thereafter the substrate was taken out of the film-forming chamber into the air and placed in a film-forming chamber of a sputtering device. Then, an interlayer 4 made only of a zinc oxide layer having a thickness of 1000 Å was formed.

A refractive index of the zinc oxide layer was measured by a spectroscopic ellipsometry method, and was determined to be 2.10 at a wavelength of 600 nm. Subsequently, the substrate was taken out of the film-forming chamber into the air, and placed in a film-forming chamber of a CVD device. Then, a crystalline silicon photoelectric conversion unit 5 was formed by the same method. A back face electrode layer 6 was further formed on the crystalline silicon photoelectric conversion unit 5.

Then, a spectral sensitivity characteristic was measured by the same method. The spectral sensitivity current was 12.6 mA/cm$^2$ in the front photoelectric conversion unit and 12.4 mA/cm$^2$ in the back photoelectric conversion unit. The controlled current is 12.4 mA/cm$^2$ since the front and the back photoelectric conversion units are connected in series. A summary of the spectral sensitivity current is shown in Table 2.

Example 6

FIG. 6 is a cross-sectional view schematically showing an amorphous silicon solar cell produced in Example 6. First, white sheet glass of 125 mm×125 mm×0.7 mm-thick was prepared as a transparent insulating substrate 7. A transparent conductive film 8 having a minute irregular structure on the surface made of tin oxide was formed on a principal plane of the transparent insulating substrate 7 by a thermal CVD method. The film thickness of the transparent conductive film 8 was 0.8 µm, the haze ratio measured with C light source irradiated from the transparent conductive film 8 side by using a haze meter (model number "NDH5000W", manufactured by Nippon Denshoku Industries Co., Ltd.) was 11%, and the sheet resistance was 8 Ω/□.

Next, the transparent insulating substrate 7 with the transparent conductive film 8 formed was introduced into a high-frequency plasma enhanced CVD device for forming an amorphous silicon photoelectric conversion unit 9. An amorphous p-type silicon carbide (p-type a-SiC) layer 9p having a film thickness of 150 Å was formed. In forming the p-type a-SiC layer 9p, SiH$_4$, hydrogen, hydrogen-diluted B$_2$H$_6$, and CH$_4$ were used as reactant gases until the point of time when the film thickness of the p-type a-SiC layer 9p corresponds to 80 Å. Then the supply of hydrogen-diluted B$_2$H$_6$ and CH$_4$ was stopped while maintaining the discharge, and formation of the residual 70 Å of the layer was performed. Subsequently, an amorphous i-type silicon photoelectric conversion layer 9i having a film thickness of 0.27 µm and an n-type microcrystalline silicon layer 9n having a film thickness of 150 Å were sequentially superimposed thereon.

A substrate with the amorphous photoelectric conversion unit 9 formed was taken out of the high-frequency plasma enhanced CVD device into the air, and thereafter placed in a film-forming chamber of a sputtering device for forming a transparent electrode layer 10 made of zinc oxide by a sputtering method. Here, 2-wt % Al was added to zinc oxide as a sputtering target, Ar gas was introduced as sputtering gas, the substrate was heated to a temperature of 150° C., and the pressure was 0.27 Pa. Zinc oxide having a film thickness of 900 Å was formed by a DC sputtering method.

The substrate with the transparent electrode layer 10 formed was taken out of the film-forming chamber into the air, and thereafter placed into a high-frequency plasma enhanced CVD device for forming a hard carbon layer 11 by a CVD method. Methane (a methane concentration of 100% by volume) was used as a raw material, a substrate temperature was 150° C. and a discharge power was 200 W. A diamond-like carbon film having a film thickness of 400 Å was formed by using a plasma enhanced CVD device.

The substrate with the hard carbon layer 11 formed was taken out of the high-frequency plasma enhanced CVD device into the air, and thereafter placed in a sputtering device to form a metal layer made of Ag having a film thickness of 2000 Å as a high reflecting electrode layer 12 by a DC sputtering method.

A photoelectric conversion unit with a light-receptive area of 1 square cm was separated from the amorphous silicon solar cell obtained as described above and photoelectric conversion characteristics thereof were measured. That is, artificial sunlight having a spectral distribution of AM 1.5 and with an energy density of 100 mW/cm$^2$ was irradiated by using a solar simulator under a temperature of 25° C. so that output characteristics were measured. An open circuit voltage was 0.84 V, a short-circuit current density was 17.1 mA/cm$^2$, a fill factor was 71.0% and a conversion efficiency was 10.19%.

Example 7

Example 7 was different from Example 6 only in the film thickness of the transparent electrode layer 10 and the forming method for the hard carbon layer 11. More specifically, an amorphous silicon photoelectric conversion unit 9 was formed and then transparent electrode layer 10 having a film thickness of 150 Å was formed by the same method as that in Example 6. Subsequently, the substrate was placed in a sputtering device for forming a hard carbon layer 11 by a sputtering method. Carbon was used as a sputtering target, H$_2$ gas was introduced as sputtering gas, the substrate was heated to a temperature of 150° C., and the pressure was 8 Pa. A diamond-like carbon having a film thickness of 1500 Å was formed by a DC sputtering method. Subsequently, a high reflecting electrode layer 12 made of Ag which is same as that in Example 6 was formed.

A photoelectric conversion unit with a light-receptive area of 1 square cm was separated from the amorphous silicon solar cell obtained as described above and photoelectric conversion characteristics thereof were measured. That is, artificial sunlight having a spectral distribution of AM 1.5 and with an energy density of 100 mW/cm$^2$ was irradiated by using a solar simulator under a temperature of 25° C. so that output characteristics were measured. An open circuit voltage was 0.85 V, a short-circuit current density was 17.0 mA/cm$^2$, a fill factor was 70.9% and a conversion efficiency was 10.24%.

Comparative Example 6

Figure 7:
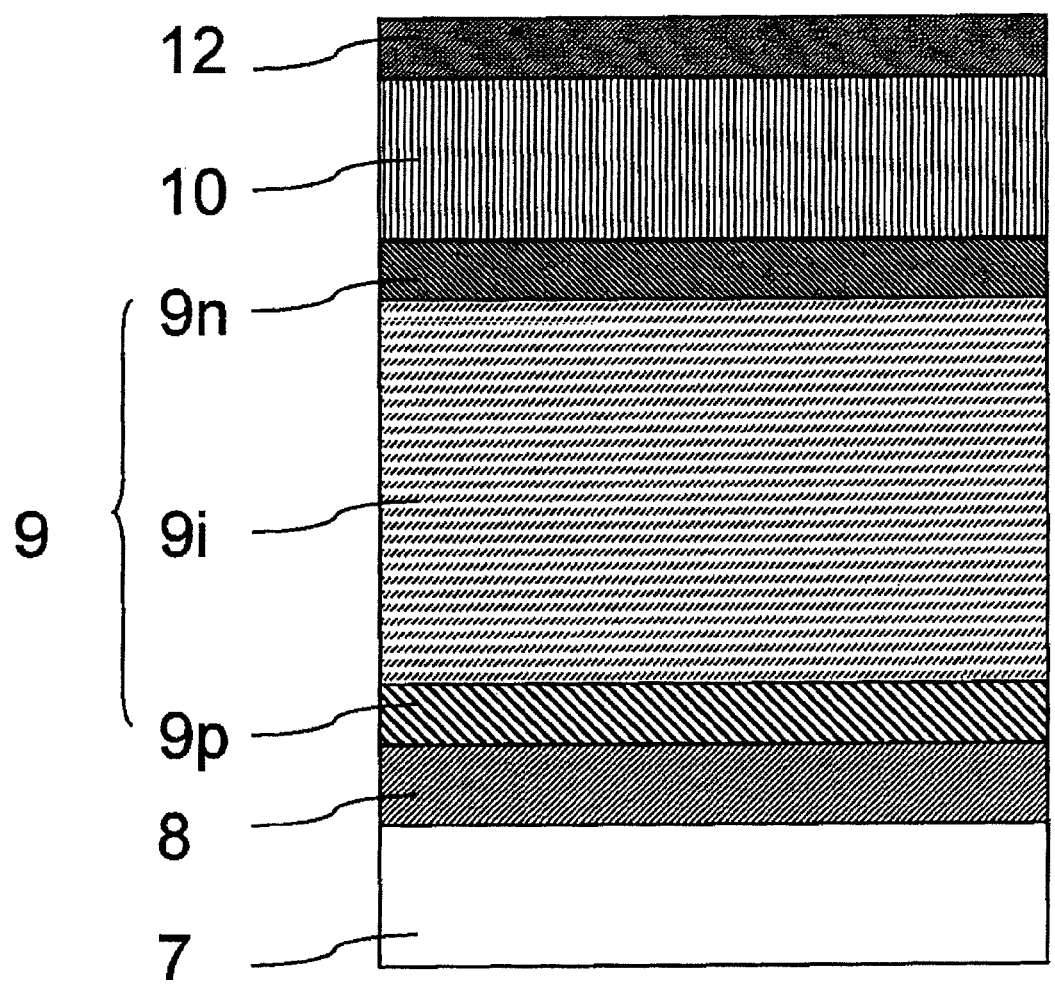
FIG. 7 is a schematic cross-sectional view of an amorphous silicon solar cell in Comparative Examples.

In Comparative Example 6 as shown in FIG. 7, a substrate with an amorphous silicon photoelectric conversion unit 9 was prepared and a transparent electrode layer 10 having a film thickness of 900 Å made of zinc oxide was formed thereon by the same method as that in Example 6. Subsequently, a high reflecting electrode layer 12 made of Ag which is same as that in Example 6 was formed.

A photoelectric conversion unit with a light-receptive area of 1 square cm was separated from the amorphous silicon solar cell obtained as described above and photoelectric conversion characteristics thereof were measured. That is, artificial sunlight having a spectral distribution of AM 1.5 and with an energy density of 100 mW/cm$^2$ was irradiated by using a solar simulator under a temperature of 25° C. so that output characteristics were measured. An open circuit voltage was 0.86 V, a short-circuit current density was 16.5 mA/cm$^2$, a fill factor was 70.3% and a conversion efficiency was 9.98%.

In comparison between Example 7 and Comparative Example 6, the film thickness of the transparent electrode layer 10 is the same but yet the insertion of the hard carbon layer 11 in Example 7 improves the short-circuit current density and the fill factor and thus the conversion efficiency is increased. It is assumed that the reason therefor is that the insertion of the hard carbon layer modifies the surface state of the transparent electrode layer and thus favorable electrical contact with the high reflecting electrode layer may be formed. Further, an incident light into the electric generating layer may be increased, since the high reflecting electrode layer having excellent reflection properties is formed, and besides, an absorption loss at the interface may be decreased.

Comparative Example 7

In Comparative Example 7 as shown in FIG. 7, a substrate with an amorphous silicon photoelectric conversion unit 9 was prepared and a transparent electrode layer 10 having a film thickness of 150 Å made of zinc oxide was formed thereon by the same method as that in Example 6 Subsequently, a high reflecting electrode layer 12 made of Ag which is same as that in Example 7 was formed.

A photoelectric conversion unit with a light-receptive area of 1 square cm was separated from the amorphous silicon solar cell obtained as described above and photoelectric conversion characteristics thereof were measured.

More specifically, artificial sunlight having a spectral distribution of AM 1.5 and with an energy density of 100 mW/cm$^2$ was irradiated by using a solar simulator under a temperature of 25° C. so that output characteristics were measured. An open circuit voltage was 0.86 V, a short-circuit current density was 16.3 mA/cm$^2$, a fill factor was 70.8% and a conversion efficiency was 9.92%.

In comparison between Example 7 and Comparative Example 7, the film thickness of the transparent electrode layer 10 is the same, but yet the insertion of the hard carbon layer 11 in Example 7 improves the short-circuit current density and the fill factor, and thus the conversion efficiency is increased. The reason therefor is assumed to be that the insertion of the hard carbon layer modifies the surface state of the transparent electrode layer, and thus favorable electrical contact with the high reflecting electrode layer, in the same manner as that in Example 7, may be formed. Further, an incident light into the electric generating layer may be increased, since the high reflecting electrode layer having excellent reflection properties is formed, and besides, an absorption loss at the interface may be decreased.

Comparative Example 8

Figure 8:
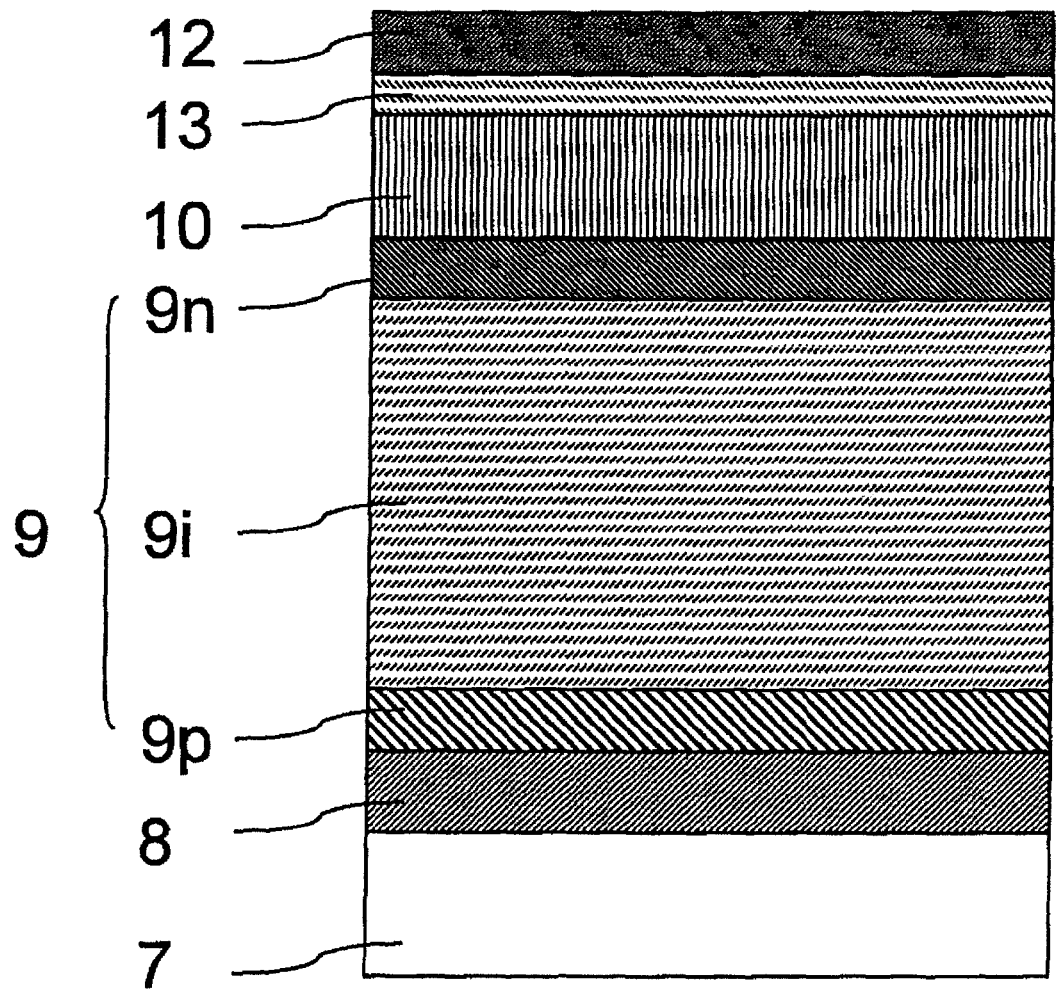
FIG. 8 is a schematic cross-sectional view of the amorphous silicon solar cell in Comparative Examples.

Comparative Example 8 which is shown in FIG. 8 was different from Example 6 only in that the film thickness of the transparent electrode layer 10 was different and an SiO$_2$ layer 13 was inserted instead of the hard carbon layer 11. More specifically, in the Comparative Example 8, a substrate with an amorphous silicon photoelectric conversion unit 9 was prepared and a transparent electrode layer 10 having a film thickness of 400 Å made of zinc oxide was formed thereon by the same method as that in Example 6.

Then, an $SiO_2$ layer 13 having a film thickness of 400 Å was formed by a DC sputtering method. $SiO_2$ was used as a sputtering target, Ar gas was introduced as sputtering gas, the substrate was heated to a temperature of 150° C., and the pressure was 0.27 Pa. Subsequently, a high reflecting electrode layer 12 made of Ag which is same as that in Example 6 was formed.

TABLE 3

|  | Open circuit voltage (V) | Short-circuit current density (mA/cm$^2$) | Fill factor (%) | Conversion efficiency (%) |
| --- | --- | --- | --- | --- |
| Example 6 | 0.84 | 17.1 | 71.0 | 10.19 |
| Example 7 | 0.85 | 17.0 | 70.9 | 10.24 |
| Comparative Example 6 | 0.86 | 16.5 | 70.3 | 9.98 |
| Comparative Example 7 | 0.86 | 16.3 | 70.8 | 9.92 |
| Comparative Example 8 | 0.78 | 15.2 | 58.0 | 6.87 |

A photoelectric conversion unit with a light-receptive area of 1 square cm was separated from the amorphous silicon solar cell obtained as described above and photoelectric conversion characteristics thereof were measured. More specifically, artificial sunlight having a spectral distribution of AM 1.5 and with an energy density of 100 mW/cm$^2$ was irradiated by using a solar simulator under a temperature of 25° C. so that output characteristics were measured. An open circuit voltage was 0.78 V, a short-circuit current density was 15.2 mA/cm$^2$, a fill factor was 58.0% and a conversion efficiency was 6.87%.

Comparing Comparative Example 8 with Examples 6 and 7, the characteristics, especially in fill factor, are greatly deteriorated in the case of using the $SiO_2$ layer. The reason therefor is assumed to be that the $SiO_2$ layer is an insulating film, which is incapable of forming electrical contact and causes series resistance, while the hard carbon layer has electrical conductivity as to be capable of forming a favorable electrical contact with the high reflecting electrode layer.

The invention claimed is:

1. A thin-film photoelectric conversion device comprising a plurality of silicon-based photoelectric conversion units connected in series through an interlayer, wherein
the interlayer is a transparent oxide layer and n pairs of layers stacked therebehind (n is an integer of 1 or more), wherein each pair of layers is a carbon layer and a transparent oxide layer stacked in this order, such that the carbon layer is connected to the photoelectric conversion units through the transparent oxide layers,
wherein one or more of the carbon layers contains hydrogen.

2. The thin-film photoelectric conversion device according to claim 1, wherein one or more of the transparent oxide layers is formed out of zinc oxide.

3. The thin-film photoelectric conversion device according to claim 1, wherein one or more of the transparent oxide layers is formed out of conductive oxygenated silicon.

4. The thin-film photoelectric conversion device according to claim 1, wherein a film thickness of one or more of the transparent oxide layers is 10 Å or more and 2000 Å or less.

5. The thin-film photoelectric conversion device according to claim 1, wherein a film thickness of one or more of the carbon layers is 100 Å or more and 2000 Å or less.

6. The thin-film photoelectric conversion device according to claim 1, wherein a total film thickness of the transparent oxide layer is 40 Å or more and 4000 Å or less.

7. The thin-film photoelectric conversion device according to claim 1, wherein a total film thickness of the carbon layer is 200 Å or more and 4000 Å or less.

8. The thin-film photoelectric conversion device according to claim 1, wherein a transparent insulating substrate is located on a light incidence side, and a first transparent electrode layer, the photoelectric conversion units connected in series, a second transparent electrode layer having electrical conductivity, a hard carbon layer having electrical conductivity, and a high reflecting electrode layer are stacked in this order on an opposite surface from the light incidence side of the transparent insulating substrate.

9. The thin-film photoelectric conversion device according to claim 8, wherein the hard carbon layer having electrical conductivity comprises diamond-like carbon.

10. The thin-film photoelectric conversion device according to claim 8, wherein the second transparent electrode layer is made of zinc oxide.

11. The thin-film photoelectric conversion device according to claim 8, wherein a film thickness of the second transparent electrode layer is 50 Å or more and 5000 Å or less.

12. The thin-film photoelectric conversion device according to claim 8, wherein a film thickness of the hard carbon layer having electrical conductivity is 5 Å or more and 2000 Å or less.

13. A thin-film photoelectric conversion device comprising a plurality of silicon-based photoelectric conversion units connected in series through an interlayer, wherein
the interlayer is a transparent oxide layer and n pairs of layers stacked therebehind (n is an integer of 1 or more), wherein each pair of layers is a carbon layer and a transparent oxide layer stacked in this order, such that the carbon layer is connected to the photoelectric conversion units through the transparent oxide layers,
wherein a refractive index of one or more of the carbon layers is 1.25 or more and 1.90 or less against a light with a wavelength of 600 nm.

14. A thin-film photoelectric conversion device comprising a plurality of silicon-based photoelectric conversion units connected in series through an interlayer, wherein
the interlayer is a transparent oxide layer and n pairs of layers stacked therebehind (n is an integer of 1 or more), wherein each pair of layers is a carbon layer and a transparent oxide layer stacked in this order, such that the carbon layer is connected to the photoelectric conversion units through the transparent oxide layers,
wherein any one of the carbon layers comprises diamond-like carbon.

* * * * *